(12) United States Patent
Katakura

(10) Patent No.: US 7,019,567 B2
(45) Date of Patent: Mar. 28, 2006

(54) SINE WAVE GENERATION CIRCUIT

(75) Inventor: Masayuki Katakura, Kanagawa (JP)

(73) Assignee: Sony Corporation, (JP)

( * ) Notice: Subject to any disclaimer, the term of this patent is extended or adjusted under 35 U.S.C. 154(b) by 73 days.

(21) Appl. No.: 10/824,343

(22) Filed: Apr. 15, 2004

(65) Prior Publication Data

US 2004/0217784 A1    Nov. 4, 2004

(30) Foreign Application Priority Data

Apr. 30, 2003    (JP) ............................ P2003-125583

(51) Int. Cl.
*H02M 1/12*    (2006.01)
(52) U.S. Cl. ........................ 327/129; 327/105
(58) Field of Classification Search ........ 327/105–107, 327/113, 129
See application file for complete search history.

(56) References Cited

U.S. PATENT DOCUMENTS

| 5,504,445 | A | * | 4/1996 | Miki | .......................... 327/129 |
| 5,598,440 | A | * | 1/1997 | Domagala | .................... 375/329 |
| 6,483,356 | B1 | * | 11/2002 | Suzuki et al. | ................. 327/129 |
| 6,587,862 | B1 | * | 7/2003 | Henderson | ................... 708/276 |
| 2005/0195014 | A1 | * | 9/2005 | Katakura | ..................... 327/355 |

FOREIGN PATENT DOCUMENTS

| JP | 361098003 | * | 5/1986 |
| JP | 405063783 | * | 3/1993 |
| JP | 05-183341 |   | 7/1993 |
| JP | 10-209757 |   | 8/1998 |

* cited by examiner

*Primary Examiner*—Dinh T. Le
(74) *Attorney, Agent, or Firm*—Rader, Fishman & Grauer PLLC; Ronald P. Kananen

(57) ABSTRACT

A sine wave generation circuit for generating a high precision pseudo sine wave without increasing the circuit size including a pulse generation circuit for generating a plurality of pulse signals using an input clock signal as reference and a voltage output circuit for stepwise changing the voltage level of the output on the basis of a plurality of pulse signals. The voltage output circuit generates a plurality of different coefficients in response to a combination of bit information in a plurality of pulse signals and changes the output of the voltage output circuit in response to a coefficient series obtained when further combining the plurality of generated coefficients, and odd number generation circuits each generating odd number values of ternary-values or more having positive side coefficients and negative side coefficients symmetric about a center coefficient are provided in a plurality of coefficient generation circuits provided in the voltage output circuit.

7 Claims, 20 Drawing Sheets

1 ---- SINE WAVE GENERATION CIRCUIT
3 ---- VOLTAGE OUTPUT CIRCUIT
SW1~SWn ---- COEFFICIENT GENERATION CIRCUIT

1 --- SINE WAVE GENERATION CIRCUIT
3 --- VOLTAGE OUTPUT CIRCUIT
SW1~SWn --- COEFFICIENT GENERATION CIRCUIT

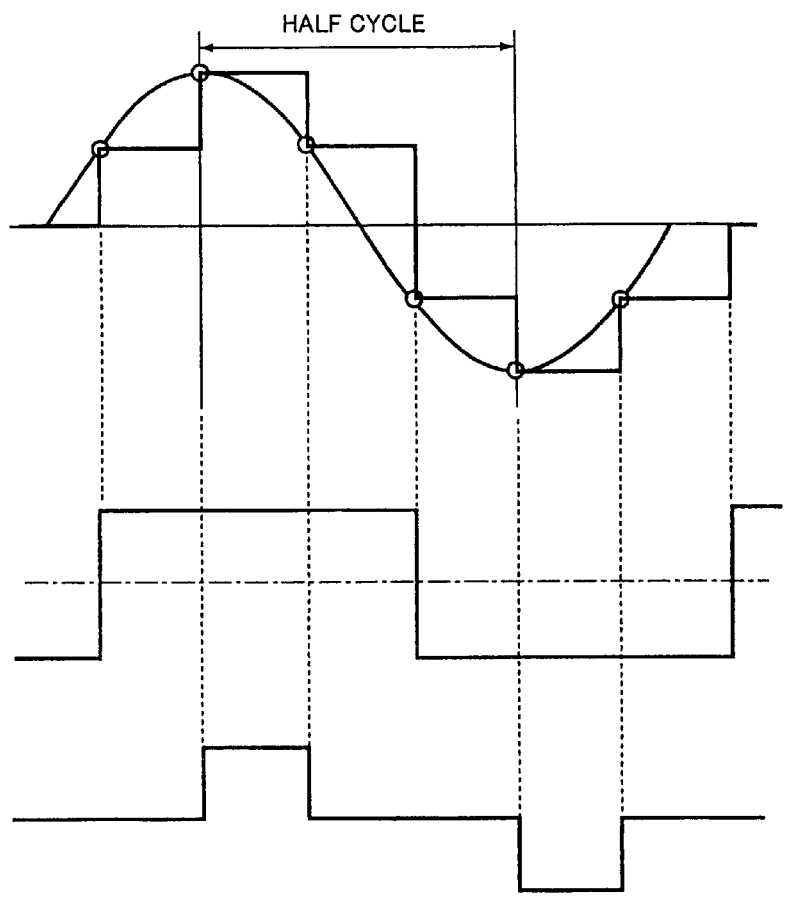

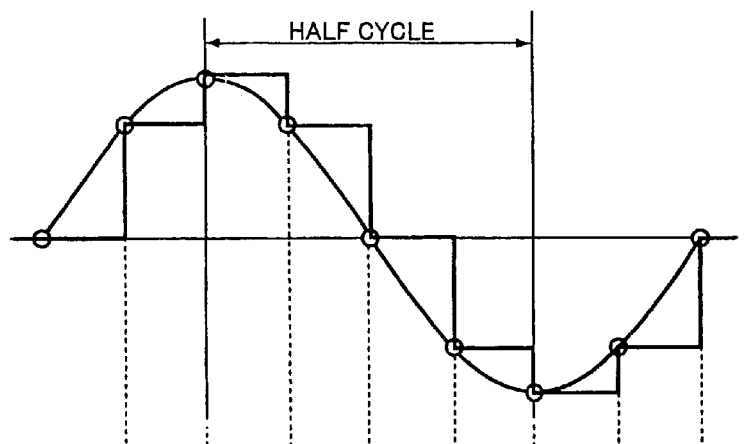
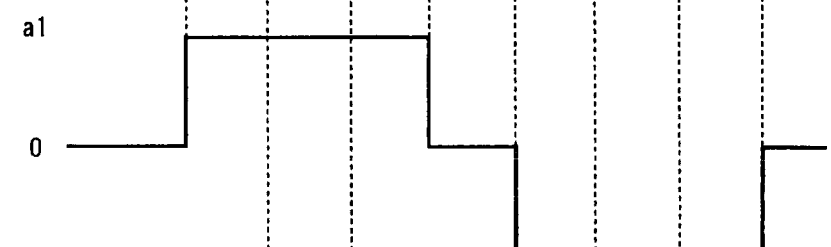
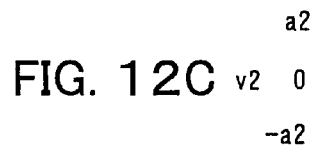
FIG. 12A vout
FIG. 12B v1
FIG. 12C v2

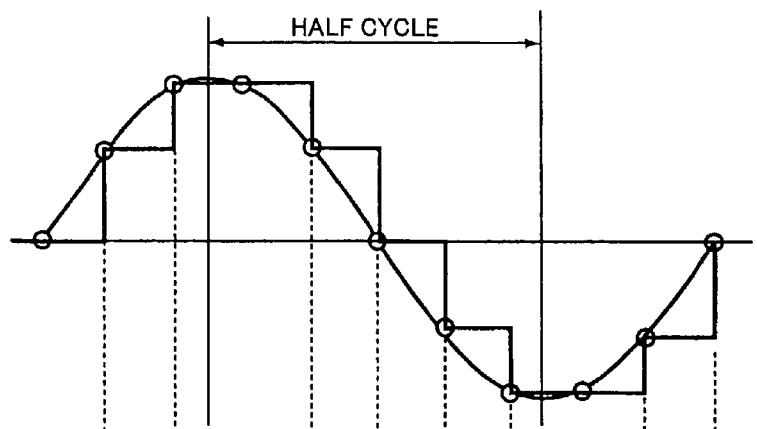
FIG. 13A vout
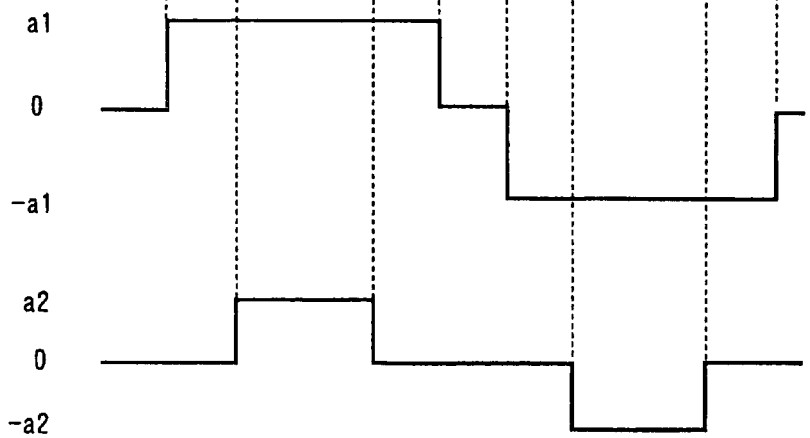
FIG. 13B v1
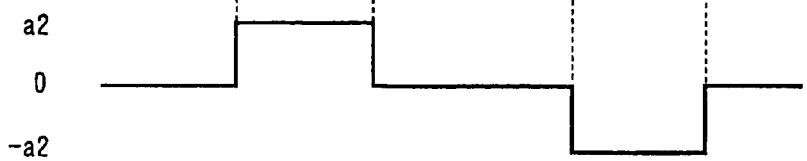
FIG. 13C v2

1··· SINE WAVE GENERATION CIRCUIT
5··· RESISTOR LADDER CIRCUIT
6··· LOW PASS FILTER
SW1~SW4··· COEFFICIENT GENERATION CIRCUIT

10 ···· BINARY-VALUE GENERATION CIRCUIT
11 ···· TERNARY-VALUE GENERATION CIRCUIT

SINE WAVE GENERATION CIRCUIT

BACKGROUND OF THE INVENTION
TERNARY TRENARY

1. Field of the Invention

The present invention relates to a sine wave generation circuit for stepwisely changing a voltage level of an output in synchronization with an input clock signal and generating a pseudo sine wave.

2. Description of the Related Art

Generation of a sine wave signal is a very important in analog signal processing. There are various means for realizing this depending on the application and the required precision. The performance required for a circuit for generation of a sine wave signal is defined as the ability to generate a high precision sine waveform in synchronization with a reference digital clock signal. A "high precision waveform" means a waveform having an accurate phase, a low harmonic component, and an accurate signal amplitude with respect to the clock.

As the configuration of a sine wave generation circuit, a sine wave circuit of a so-called D/A conversion type for generating a pseudo sine wave by generating a binary-value pulse signal controlling the timing and changing an input resistance of an output amplifier by this is known (see for example Japanese Unexamined Patent Publication (Kokai) No. 5-183341 and Japanese Unexamined Patent Publication (Kokai) No. 10-209757).

In the technology disclosed in Japanese Unexamined Patent Publication (Kokai) No. 5-183341, switches are connected to nodes of a resistor series, and the on/off timings of the switches are controlled. The circuit for generating a binary-value signal for controlling the timing has a counter for counting the input clock signals, sequentially dividing each by ½, and outputting the same and a circuit for generating isolated pulse signals successively shifted by one clock pulse each by a logical operation of the divided signals.

The technology disclosed in Japanese Unexamined Patent Publication (Kokai) No. 10-209757 has a plurality of resistors connected in parallel between a constant current source and a ground potential and switches connected in series to the resistors and controls the on/off timings of these switches. The circuit for generating the binary-value signal for controlling the timing is basically the same as the one in the technology disclosed in Japanese Unexamined Patent Publication (Kokai) No. 5-183341 and has a frequency division circuit and an N-nary ring counter.

In a conventional sine wave generation circuit having such a configuration, however, when trying to generate a high precision pseudo sine wave such as one finely sampling a sine wave, the problems are encountered that the number of divisions of the frequency division circuit and the scale of the counter increase along with the number of samplings of the sine wave or the logical operation circuit for generating the isolated pulse signals becomes complex.

These problems are due to the fact that the conventional sine wave generation circuit generated all control signals for generating the coefficients (resistance values) determining the voltage value of the pseudo sine wave as binary-value pulse signals by digital signal processing.

SUMMARY OF THE INVENTION

An object of the present invention is to provide a sine wave generation circuit able to simplify the circuit configuration and in addition not increasing in circuit scale so much and not becoming complex even if generating a high precision pseudo sine wave by increasing the number of the voltage changes in one cycle of the sine wave.

According to the present invention, there is provided a sine wave generation circuit comprising a pulse generation circuit for generating a plurality of pulse signals using an input clock signal as a reference; and a voltage output circuit for stepwise changing the voltage level of the output on the basis of the plurality of pulse signals output from this pulse generation circuit. The voltage output circuit has a plurality of coefficient generation circuits for generating a plurality of different coefficients in response to the combination of bit information in the plurality of pulse signals and changes the output of the voltage output circuit in accordance with a coefficient series obtained when further combining the generated plurality of coefficients.

The plurality of coefficient generation circuits include odd number generation circuits for generating odd number values of at least ternary-values including coefficients on a positive side and coefficients on a negative side arranged symmetrically about a center coefficient.

Preferably, when the number of the coefficient generation circuits is n (n is a natural number of 2 or more) at least (n−1) number of ternary-value generation circuits are included in the n number of coefficient generation circuits.

In the sine wave generation circuit configured in this way, when the clock signals are input to the pulse generation circuit, a plurality of pulse signals are generated using them as a reference. These pulse signals are used in a plurality of coefficient generation circuits provided in the voltage output circuit and generating a plurality of coefficients. The combination of the voltage levels of the pulse signals becomes a number corresponding to the number of the coefficients generated by the coefficient generation circuits. For this reason, in the case of for example binary-value generation, two pulse signals are necessary at the maximum, and in the case of for example ternary-value generation, three pulse signals are necessary at the maximum. When there are a plurality of binary-value generation circuits, ternary-value generation circuits, and further other ternary-value generation circuits, a plurality of pulse signals output from the pulse generation circuits are commonly used for the different coefficient generation circuits.

The plurality of coefficients generated in accordance with the combination of the bit information of these plurality of pulse signals become a gradually increasing or gradually decreasing coefficient series by a further combination. By this, a pseudo sine wave having a voltage value stepwise changing is output from the voltage output circuit. When there are n number of coefficient generation circuits, the number of the voltage changes of a half cycle of the generated pseudo sine wave becomes for example (n±1). Even if the number of used pulse signals is small, when the number n of coefficient generation circuits is increased, the fineness of the coefficient series and consequently the number of the voltage change points in one cycle of the pseudo sine wave increases.

BRIEF DESCRIPTION OF THE DRAWINGS

These and other objects and features of the present invention will become clearer from the following description of the preferred embodiments given with reference to the accompanying drawings, in which:

FIGS. 11A to 11C are waveform diagrams by a sampling 3B;

FIGS. 12A to 12C are waveform diagrams by a sampling 4B;

FIGS. 13A to 13C are waveform diagrams by a sampling 5;

DESCRIPTION OF THE PREFERRED EMBODIMENTS

Preferred embodiments of the sine wave generation circuit according to the present invention will be described next with reference to the accompanying drawings.

First Embodiment

Figure 1:
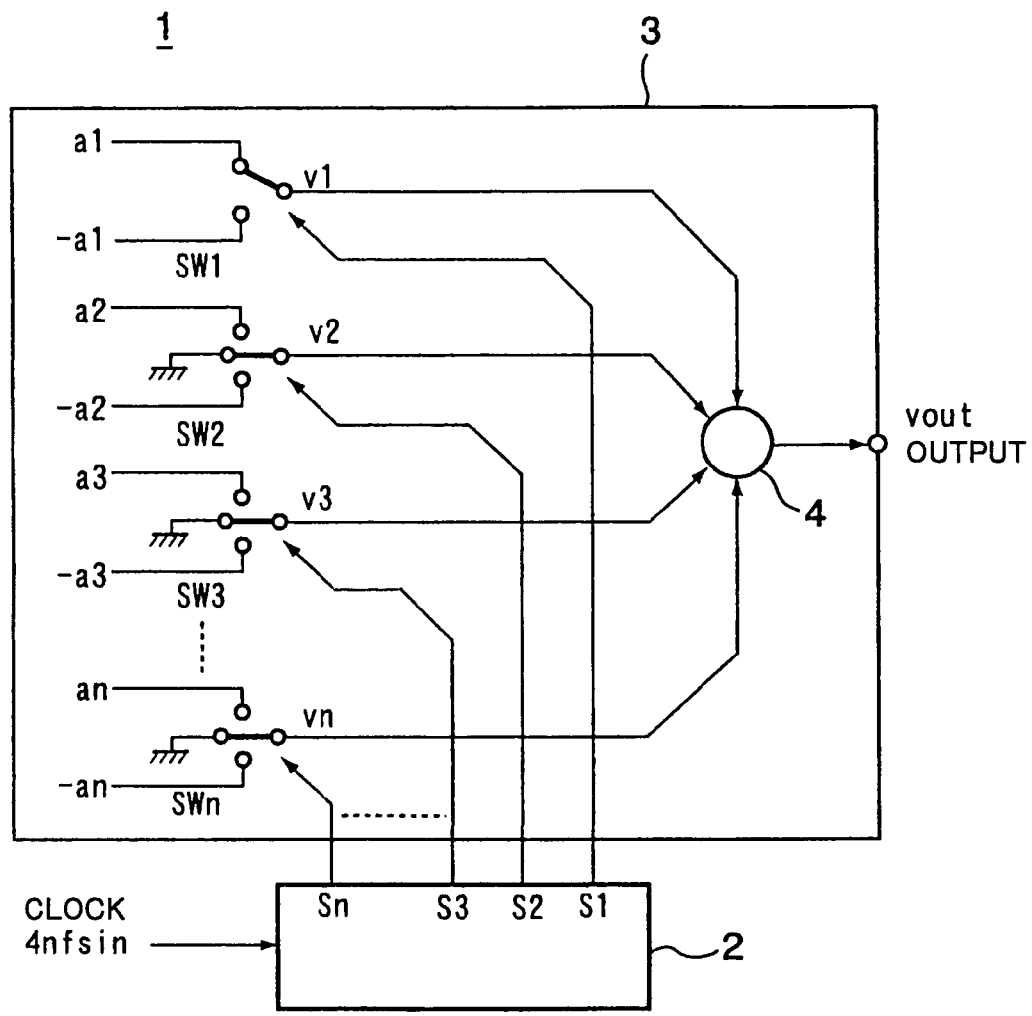
FIG. 1 is a view of an example of the configuration of a sine wave generation circuit according to a first embodiment of the present invention.

FIG. 1 shows an example of the configuration of a sine wave generation circuit according to a first embodiment of the present invention.

A sine wave generation circuit 1 has a pulse generation circuit 2 for generating a plurality of pulse signals S1, S2, S3, ..., Sn and a voltage output circuit 3 for generating a plurality of different coefficients in accordance with the combination of bit information in these plurality of pulse signals and stepwise changing the voltage level of an output vout in accordance with the coefficient series obtained when further combining the generated plurality of coefficients.

The voltage output circuit in the embodiment of the present invention has n number of coefficient generation circuits and has (n−1) number of odd number generation circuits for generating odd number values of ternary-values or more in the n number of coefficient generation circuits. Here, the odd number values may be quinary-values, septenary-values, ... too, but these can be obtained by ternary-value generation circuits (or a combination of ternary-value generation circuits and binary-value generation circuits).

In the description of the following embodiments, an explanation will be given by assuming that the odd number generation circuit is the basic ternary-value generation circuit. Further, this assumes that the odd number generation circuit is a switch circuit for switching a plurality of coefficients. Note that as another configuration of the coefficient generation circuit, a configuration weighting the coefficients by passing a pulse signal can also be employed. This configuration will be explained in another embodiment explained later.

Here, when n is 2 or more, one switch circuit outputs binary-values or ternary-values, and the remaining (n−1) number of switch circuits output ternary-values.

The voltage output circuit 3 in the example of configuration shown in FIG. 1 has one binary-value first switch circuit SW1, (n−1) number of ternary-value second switch circuits SW2, SW3, ..., SWn, and an adder 4 for adding outputs v1 to vn of them. The first switch circuit SW1 for selecting binary-values constitutes an embodiment of the "binary-value generation circuit" of the present invention, while the second to the n-th switch circuits SW2, SW3, ..., SWn for selecting ternary-values constitute embodiments of the "ternary-value generation circuit" of the present invention.

The first switch circuit SW1 switches between the binary-values of a1 and −a1 and generates the output v1. The other (n−1) switch circuits Swi (i=2, 3, ..., n) switch among the ternary-values of a1, 0, and −a1 and generate the output vi. The switch circuits SW1 to SWn are controlled by the pulse generation circuit 2 for generating the pulse signals S1 to Sn. The pulse generation circuit 2 generates the pulse signals S1 to Sn based on a clock signal CLK having a frequency 2m times the frequency fsin of the pseudo sine wave sought and supplies the same to the switch circuits.

FIGS. 2A to 2C show waveform diagrams of the sine wave generation circuit in a case of n=2 as the simplest example. FIG. 2B is a waveform diagram of the output v1 of the first switch circuit SW1 for switching between binary-values; and FIG. 2C is a waveform diagram of the output v2 of the second switch circuit SW2 for switching among ternary-values.

The first switch circuit SW1 outputs a rectangular wave of the binary-values of "a1" and "−a1" as shown in FIG. 2B. The second switch circuit SW2 outputs "0" in two periods of ¼ cycle at an interval of ¼ cycle in one cycle as shown in FIG. 2C, outputs "a2" in one ¼ cycle during that, and outputs "−a2" in the other ¼ cycle. As a result, the output vout of the adder 4 becomes the step wave having quarterly-values as in FIG. 2A.

Next, let us study how much many values of the coefficients a1 and a2 should be set in order to generate a signal nearer a sine wave. A signal nearer a sine wave is naturally a signal obtained by sampling the sine wave by the sampling theory. FIG. 2A shows a case where the step wave output from the adder 4 becomes the sampling result of the sine wave Sinωt by primary holding. Here, for this purpose, it is found what relative magnitudes the values of the coefficients a1 and a2 must have.

In the example shown in FIG. 2A, it can be considered that eight points were sampled for one cycle. The sampling points become symmetric with respect to the time ty having the maximum value, that is, a pair of the sampling points having the same distance from the time axis of ty have the same value, therefore, the sampling points are deviated by 1/16 cycle with respect to the reference time tx of the sine wave. The fact that the sampling points become symmetric with respect to the time ty having the maximum value is natural for a sine wave shape. A pseudo sine wave obtained by addition of the rectangular waves can be easily generated by this. Here, the times t0 and t3, times t1 and t2, times t4 and t7, and times t5 and t6 have the same values (voltage levels).

From the above description, for the generation of sampling points nearer a sine wave, a1 is $\mathrm{Sin}(\pi/8) \approx 0.383$, a1+a2 is $\mathrm{Sin}(3\pi/8) \approx 0.924$, and a1$\approx$0.383, and a2$\approx$0.541.

Figure 3:
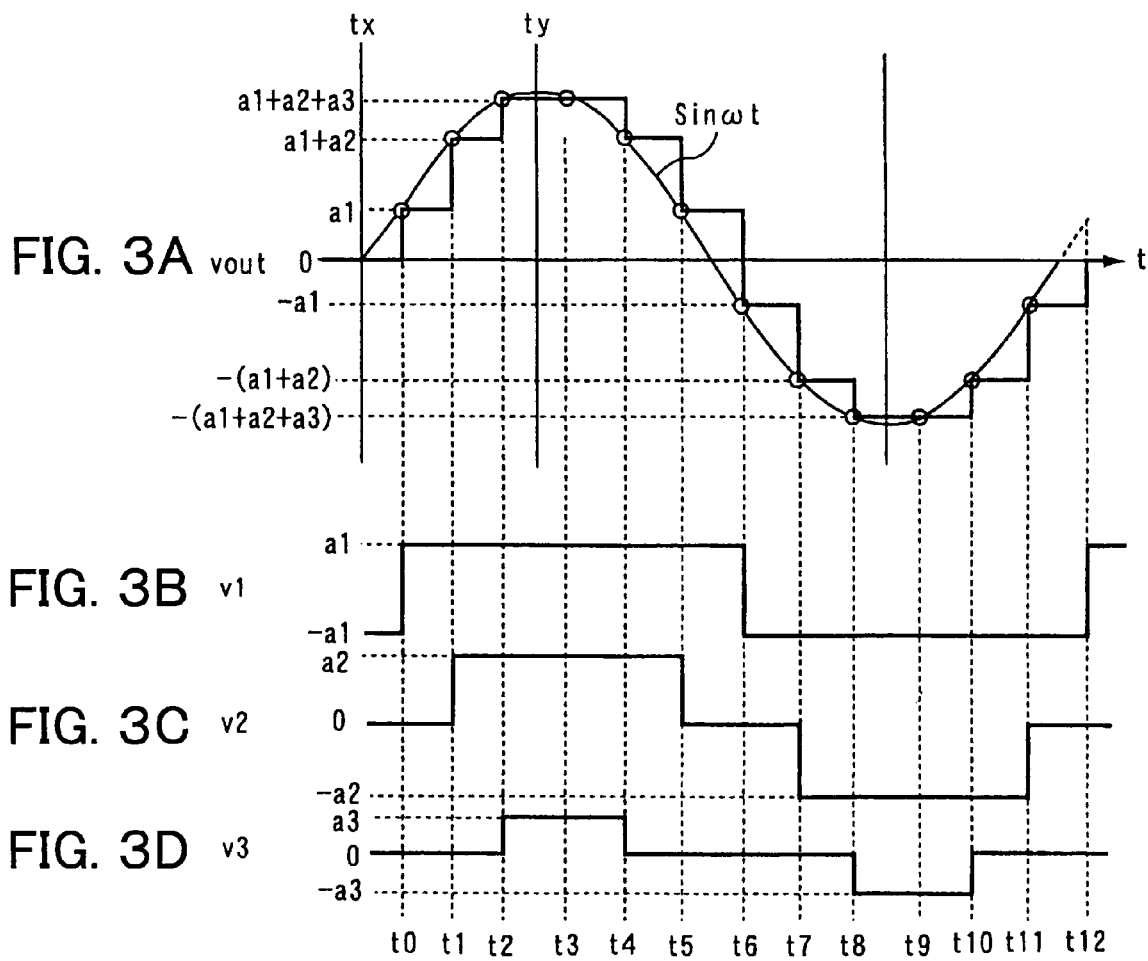
FIGS. 3A to 3D are waveform diagrams where the number of the trinary switch circuits is increased by one and n is made equal to 3 in the sine wave generation circuit shown in FIG. 1.

FIGS. 3A to 3D show waveforms of the sine wave generation circuit in a case where the number of the ternary-value switch circuits is increased by one and n is made equal to 3. FIG. 3B is a waveform diagram of the output v1 of the first switch circuit SW1 for switching among binary-values; and FIGS. 3(C) and 3(D) are waveform diagrams of the outputs v2 and v3 of second switch circuits SW2 and SW3 for switching among ternary-values.

The first switch circuit SW1 outputs a rectangular wave of binary-values of "a1" and "−a1" as shown in FIG. 3B. The second switch circuit SW2 outputs "0" in two periods of ⅙ cycle at an interval of ⅓ cycle in one cycle as shown in FIG. 3C, outputs "a2" in one ⅓ cycle during that, and outputs "−a2" in the other ⅓ cycle. The third switch circuit SW3 outputs "0" in two periods of ⅓ cycle at an interval of ⅙ cycle in one cycle as shown in FIG. 3D, outputs "a2" in one ⅙ cycle during that, and outputs "−a2" in the other ⅙ cycle. As a result, the output vout of the adder 4 becomes the step wave having quarterly-values as shown in FIG. 3A.

When n=4 or more, the control timing of the ternary-value switch circuit can be inferred in the same way as above.

If generalizing this, when the number of the switch circuits is n, the ternary-value switch circuit SWk (k=2 to n) outputs "0" in a period of ½{2n(k−1)} at an interval of 1/{n(k−1)} cycle in each cycle, outputs "ak" in one of two 1/{n(k−1)} cycles during this period, and outputs "−ak" in the other of them.

Note that, all rectangular waves have the same cycle and have the same phase.

The pulse signals S1 to Sn for controlling the generation of such rectangular waves may be pulses of binary-values or ternary-values the same as the rectangular waves too, but in general, the generation of such multi-value pulses is troublesome. Therefore, more desirably, the ternary-value switch circuits SW2 to SWn are made two-input control configurations so as to control them by two binary-value pulses. Namely, the ternary-value switch circuit is configured to switch between "a1" and "−a1" by the first pulse signal SiA (i=2 to n), forcibly make the switch "0" when the second pulse signal SiB becomes active, and not restrict the switching by the first pulse signal when the second pulse signal SiB is inactive.

Figure 4:
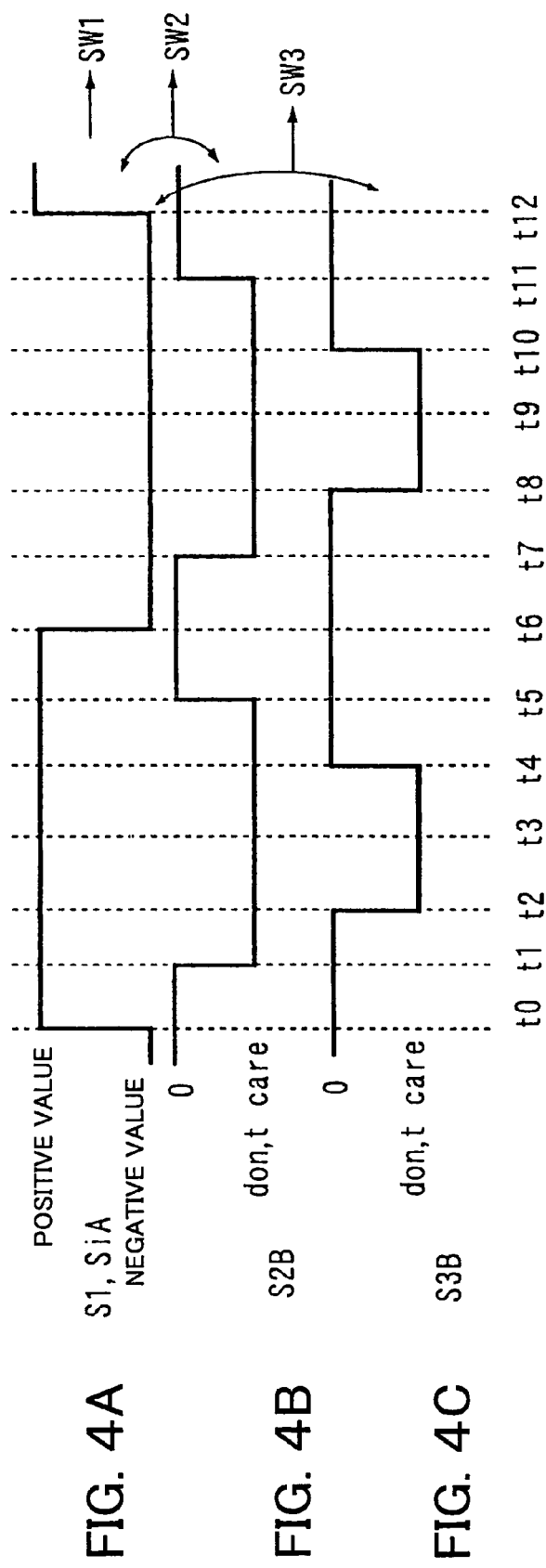
FIGS. 4A to 4C are waveform diagrams of three types of binary-value pulse signals which can be generated by a pulse generation circuit.

By configuring the circuit in this way, the switching operation as in for example FIGS. 3B to 3D can be controlled by three types of binary-value pulse signals shown in FIGS. 4A to 4C.

The pulse signal switched by the ½ cycle shown in FIG. 4A is supplied to all switch circuits as the signal S1 for driving the binary-value switch circuit SW1 and the first pulse signal SiA for driving the ternary-value switch circuits SWi. Simultaneously, the ternary-value switch circuits SW2 and SW3 switching at the timings shown in FIG. 3C and FIG. 3D, as shown in FIG. 4B and FIG. 4C, are supplied with the second pulse signal SiB which becomes "H" only when the switch circuit switches to "0" and becomes unrestricted during the other period.

Due to this, the pulse generation circuit 2 can be configured by a logic circuit having the simple functions of frequency division and shifting.

Next, the characteristics of the output signal vout will be considered.

Figure 5:
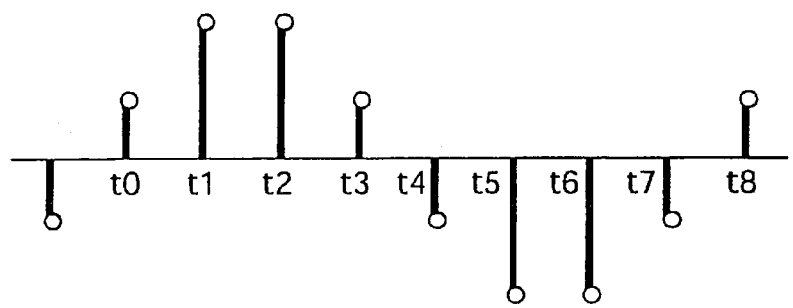
FIG. 5 is a sampling view by pulses having a frequency eight times the frequency of the sine wave.
Figure 6A:
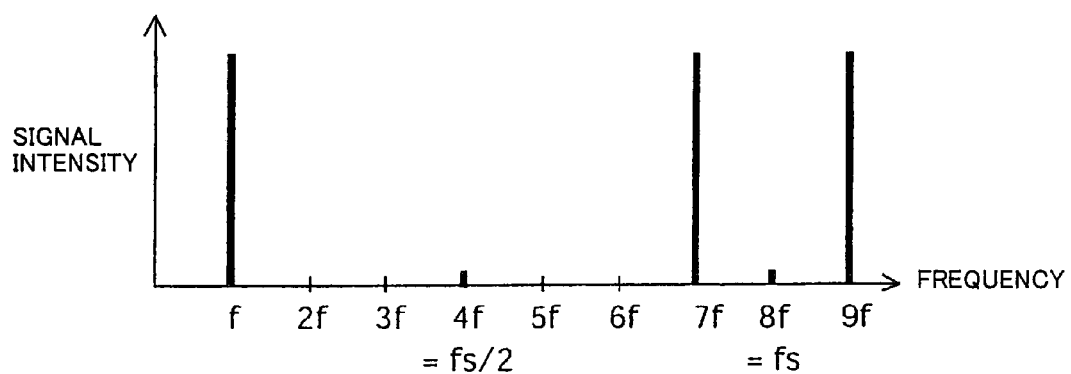
FIGS. 6A and 6B are views of a frequency spectrum after the sampling shown in FIG. 5 and a frequency spectrum after a temporary holding thereof.

If the output signal vout were obtained by sampling the sine wave by a pulse having 8 times the frequency like the waveform as shown in FIG. 5, the spectrum thereof would become as shown in FIG. 6A. The spectrum stands at the basic frequency f and positions away from the basic wave of the sampling frequency fs (=8f) and the harmonic thereof by f. In FIG. 6A, the spectrum stands at 7f and 9f. In the rectangular wave, there are no even number order harmonics (second order, fourth order, ... ), but there are strong harmonics in the odd number orders (third order, fifth order, ... ), but in contrast, this signal does not have third order and fifth order harmonics at all, but has seventh order and ninth order harmonics. The intensity of the harmonics becomes the same as the intensity of the basic wave as shown in FIG. 6A so far as the sampling is complete.

Figure 6B:
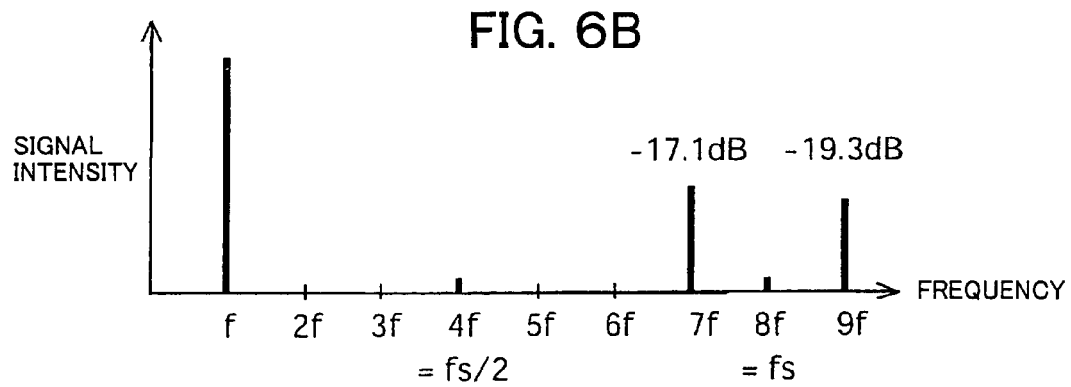

However, an actual output signal vout is not the waveform obtained by complete sampling, but a step wave obtained by primary holding that. The harmonic component at that time is given an attenuation (Sinx/x) by the well known aperture effect and becomes the spectrum as shown in FIG. 6B. It attenuates by 17 dB in the seventh order and attenuates by 19 dB in the ninth order. The seventh order and the ninth order are considerably apart from the basic wave, therefore consideration attenuation can be achieved by a simple low pass filter. Accordingly, a sine wave having a harmonic distortion rate of about 1% can be easily generated.

Next, the case where the switch circuit number n=4 will be considered.

In this case, the output signal vout becomes a step wave having octonary-values of levels and becomes equivalent to a signal obtained by sampling by a 16 time frequency. Accordingly, by deduction from the example of the number of switch circuits n=2, the spectrum can be easily found.

Figure 7:
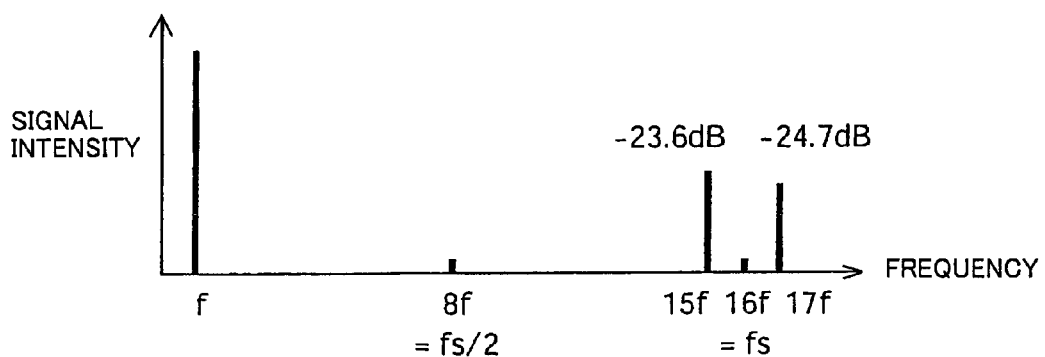
FIG. 7 is a view of a frequency spectrum after the sampling according to pulses having a frequency 16 times the frequency of the sine wave.

FIG. 7 shows the spectrum thereof. Harmonics appear at the 15-th order and the 17-th order. The magnitudes thereof become −23.6 dB, and −24.7 dB with respect to the basic wave. The magnitude of the harmonic becomes about a half and the frequency becomes about two times. Accordingly, even by a simple low pass filter, further attenuation occurs, so a harmonic distortion of about 0.1% can be extremely easily achieved.

In the same way, the output signal vout having the 16 values of levels obtained in the case where the number of switch circuits n=8 becomes equivalent to a signal sampled by a 32-time frequency, and the harmonics appear in the 31st order and the 33rd order. Accordingly, the suppression of harmonics becomes easier, and a pseudo sine wave having a harmonic distortion rate of 0.01% or less can be generated.

In the present embodiment, the method of taking the sampling points is not limited to FIG. 2A and FIG. 3A. Below, an explanation will be given of another aspect of sampling taking the case of the easiest quarterly-values output as an example.

First, as described above, the first switch circuit SW1 is not limited to a binary-value switching type and can be configured as a ternary-value switching type as well. Concerning the difference, in the sampling of the sine wave shown in FIG. 2A, it can be determined whether the first switch circuit SW1 is configured as a binary-value switching type or a ternary-value switching type according to if zero is sampled. So long as a sine wave is sampled, the sampled values must be symmetric between positive and negative. Further, except for the sampling point at which the maximum value is obtained, the same sampling values must be used two times during one cycle. This means that the sampling points must satisfy the following conditions in FIG. 2A. First, the output values (equivalent sampling values) must be symmetric about the x axis (y=0) as the axis of symmetry. Second, the sampling times must be symmetric about the time of the maximum value (ty shown in FIG. 2(A)) as the axis of symmetry.

From the above characteristics, let us consider the sampling conditions of the sine wave by at least (n−1) number of switch circuits.

Figure 8:
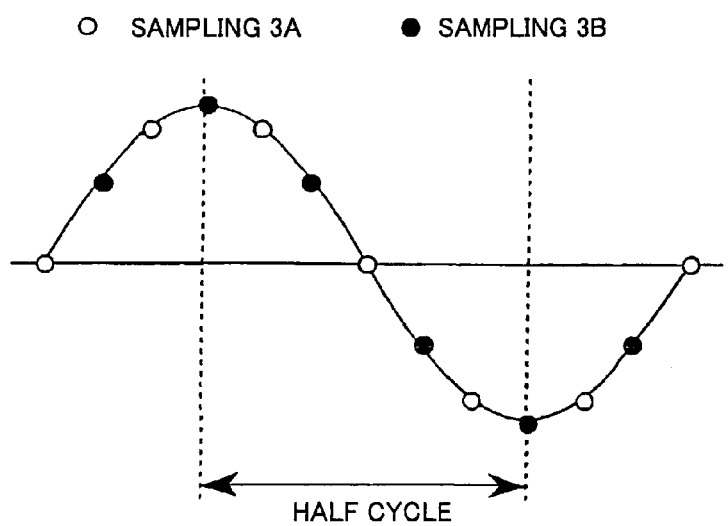
FIG. 8 is a view schematically showing the aspect of a half cycle three point sampling which can be taken in the first embodiment of the present invention.
Figure 9:
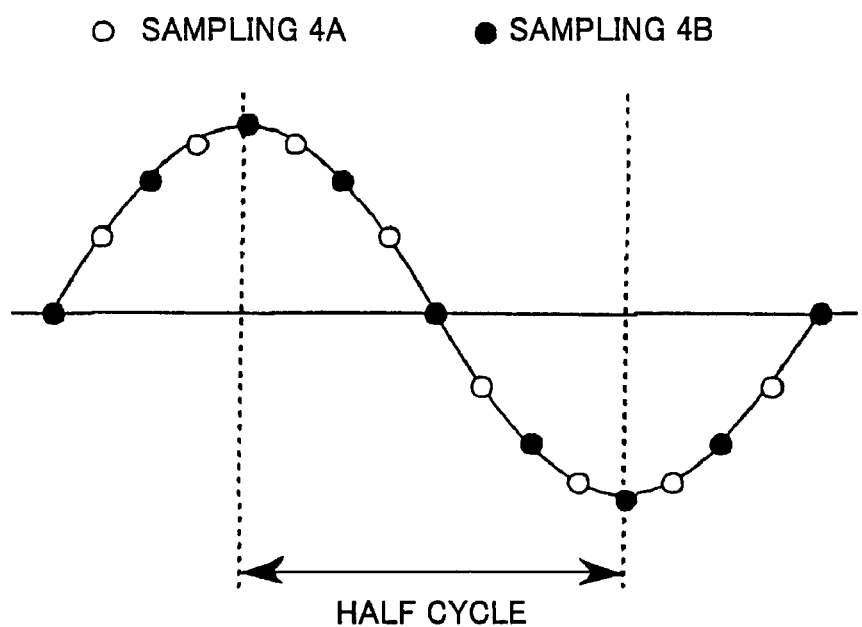
FIG. 9 is a view schematically showing the aspect of a half cycle four point sampling which can be taken in the first embodiment of the present invention.
Figure 10:
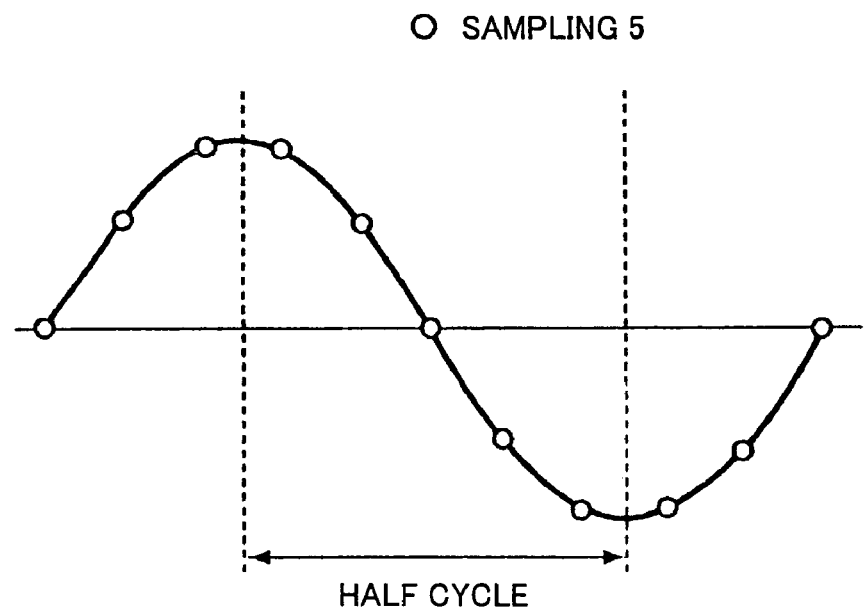
FIG. 10 is a view schematically showing the aspect of a half cycle five point sampling which can be taken in the first embodiment of the present invention.

FIG. 8 to FIG. 10 schematically show aspects of the sampling points which can be taken in the present embodiment. FIG. 8, FIG. 9, and FIG. 10 show cases of different sampling points taken in a half cycle, that is, three (=2n−1) points, four (=2n) points, and five (=2n+1) points. Further, when the methods of taking the sampling points shown in FIG. 8 to FIG. 19 are applied, when the rectangular waves output from two switch circuits are drawn based on the sampling points, they become as shown in FIG. 11 to FIG. 13.

First, the sampling must be carried out at three points at the minimum for a half cycle. Sampling of two points gives the rectangular wave itself, so is meaningless. As shown in FIG. 8, in sampling three points, there are two options of the sampling. A sampling 3A (white circles) can be realized by just one ternary-value output switch circuit since it is sufficient to output a, 0, and −a. On the other hand, when a sampling 3B (black circles) is selected, quarterly-values not including 0 are necessary. Therefore, as shown in FIG. 11B and FIG. 11C, two circuits, that is, a binary-value output switch circuit and ternary-value output switch circuit, are required. Note that the half cycle section shown in FIG. 11A is a half open section, therefore, one of the maximum value and the maximum value belongs to the neighboring half cycle section and accordingly in the case of this sampling 3B as well, there are three sampling points in the half cycle.

The sampling frequency is a six-time frequency in each method. When comparing the samplings 3A and 3B by the smallness of the number of the used switch circuits, the sampling 3A is superior and there is no positive reason for selecting the sampling 3B. However, it is not realistic to use only one ternary-value switch circuit in the case where n=2. There is the option of making another switch circuit a three-output one. This is the case where there are five points sampled (sampling 5) shown in FIG. 10 and FIG. 13.

In the above cases where the three points and five points are sampled, the number does not become a power of 2.

Next, let us consider the half cycle four point sampling wherein the number of sampling points is a power of 2.

Figure 2:
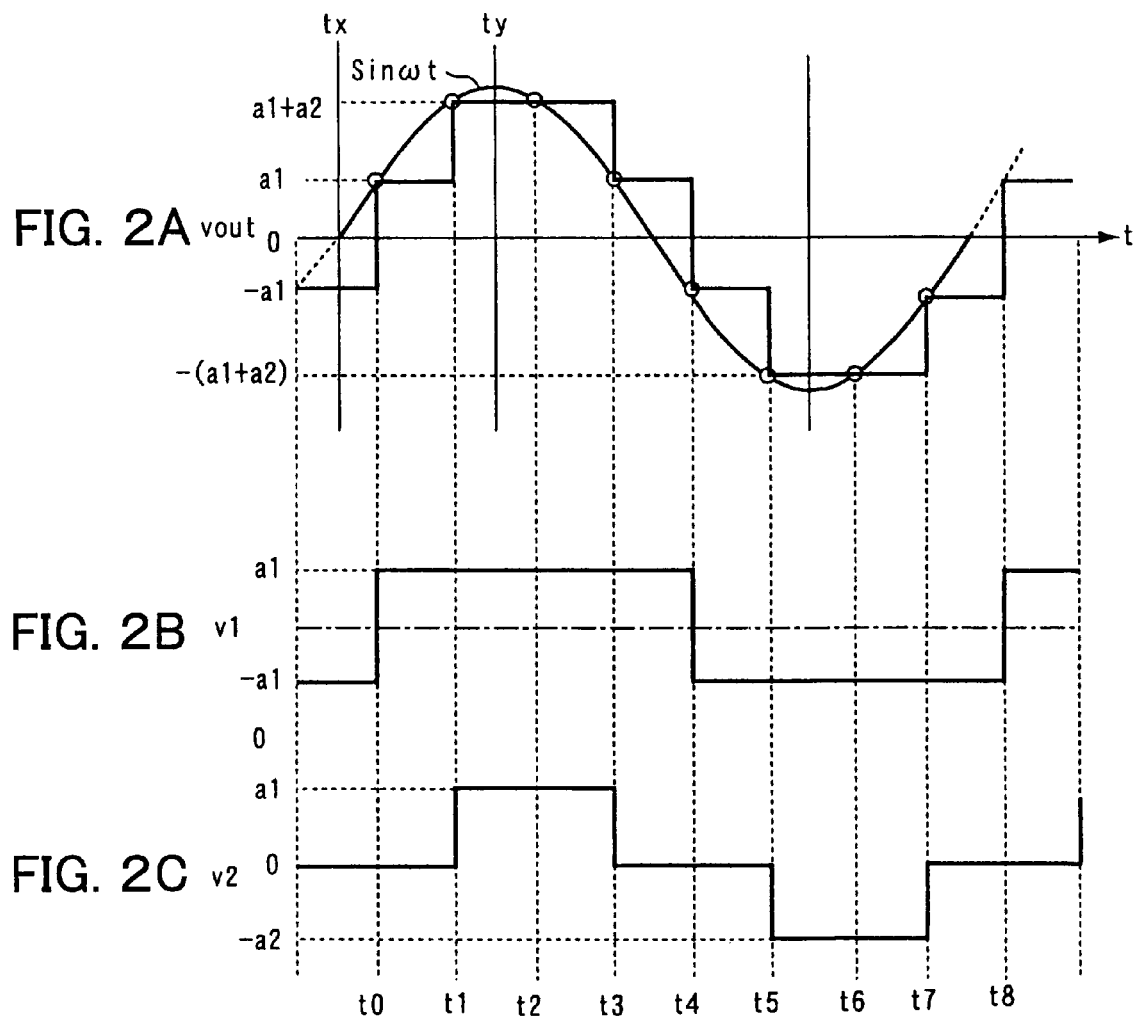
FIGS. 2A to 2C are waveform diagrams in a case of n=2 as the simplest example of the sine wave generation circuit shown in FIG. 1.

There are two options for four point sampling as well as shown in FIG. 9. A sampling 4A (white circles) does not select the zero cross point and the maximum value or the minimum value as equivalent sampling points, but a sampling 4B (black circles) selects them. As a result, in the sampling 4A, quarterly-values not including 0 are output. This is exactly the case of FIG. 2 mentioned above. As shown in FIG. 2B and FIG. 2C, it can be realized by two switch circuits, that is, a binary-value output switch circuit and a ternary-value output switch circuit. On the other hand, the sampling 4B needs a quinary-value output including 0. In this case as well, one of the maximum value and the minimum value belongs to the neighboring half cycle, so the result becomes half cycle four point sampling. For this purpose, as shown in FIG. 12B and FIG. 12C, two ternary-value output switch circuits are necessary. In this sampling 4B, the sampling efficiency is poor in comparison with the sampling 5 using two ternary-value output switch circuits in the same way as above, and there is no positive reason for selecting this.

By expanded analogy from the above, let us consider a general solution for the equivalent sampling operation of 2m points in one cycle of the generated sine wave.

In the case where m is a power of 2, for the sampling, there are a first option of selecting the sampling points not including 0 or the maximum value or the minimum value (a group including the sampling 4A) and a second option including 0 and the maximum value or the minimum value (a group including the sampling 4B). A binary-value output is sufficient only for the first switch circuit in the first option, while a ternary-value output is required for all switching means in the second option. The sampling frequency (=2mf) is 4nf, that is, m=2n where the number of switch circuits is n. In general, the first option is superior as the means for realization.

When m is not a power of 2, that is, when the common divisor includes an odd number, the sampling includes 0. There are a first option of selecting sampling points not including the maximum value and the minimum value (a group including the sampling 5) and a second option for selecting sampling points not including 0, but including the maximum value or the minimum value (a group including the sampling 3B). In the first option, ternary-value output switch circuits are necessary for all circuits. In the second option, only the first switch circuit need be a binary-value output type; all of the other switch circuits may be ternary-value output types. Accordingly, the relationships between the sample number m of the half cycle and the number of switch circuits n become m=2n+1 in the case of the first option and becomes m=2n−1 in the case of the second option. Of course, generally, the first option is superior as the means of realization.

According to the sine wave generation circuit 1 shown in FIG. 1, the voltage generation circuit 3 includes n number of ternary-value or other higher odd number value (for example ternary-value) switch circuits or (n−1) number of odd number value switch circuits and one binary-value switch circuit. Therefore, (2n+1) at most or 2n at least coefficients are generated in the half cycle, and a pseudo sine wave having a voltage level changing in accordance with this can be generated. Accordingly, a pseudo sine wave having a high degree of fineness can be efficiently generated. Further, since the odd number value switch circuits are used, therefore, the coefficients determining the positive voltage level and the coefficients determining the negative voltage level can be symmetrically generated and phase deviation is hard to occur. The pulse signals for control may be binary-value pulses generated by applying simple frequency division and shift to the clock signals. In addition, from the relationship that the efficiency of the coefficient generation is high, the number of pulse signals for generating a pseudo sine wave having the same degree of fineness may be made smaller, therefore the load of the pulse generation circuit 2 is small.

In this way, the use of odd number value switch circuits in the sine wave generation circuit gives various advantages.

Next, the fact that the sine wave generation circuit shown in FIG. 1 can be realized by an extremely simple circuit will be shown. The most suitable method for expressing the accurate ternary-values of a, 0, and −a is the usage of a current switch for the switch circuit.

Figure 14:
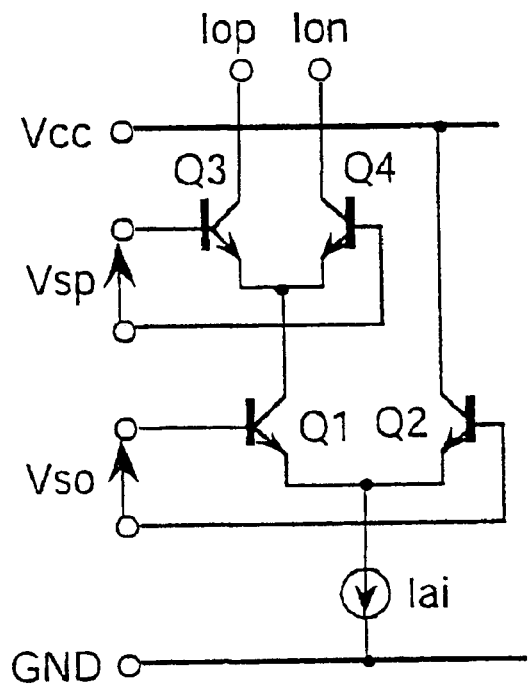
FIG. 14 is a circuit diagram of a first example of configuration of a current switch circuit (switch circuit) in the first embodiment of the present invention.

FIG. 14 shows a first example of the configuration of the current switch circuit (switch circuit).

A transistor Q2 and a constant current source for supplying a constant current Iai are connected in series between a supply line of the power supply voltage Vcc and a supply line of a ground potential GND. Transistors Q1 and Q3 are connected in series between a middle point of connection between the transistor Q2 and the constant current source and a positive output terminal Iop. Further, a transistor Q4 is connected between the middle point of connection of these transistors Q1 and Q3 and a negative output terminal Ion. Bases of the transistors Q3 and Q4 are supplied with a voltage Vsp as the bit information of either of the pulse signals S2 to Sn. A voltage Vso is also supplied as other bit information between the bases of the transistors Q1 and Q2.

In the current switch circuit having such a configuration, two sets of current switches of transistors Q1 and Q2 and Q3 and Q4 are vertically stacked on the constant current source for supplying the current Iai to control the current to the positive output terminal Iop and the negative output terminal Ion.

The first current switch formed by the transistors Q1 and Q2 controls whether or not the current Iai is to be supplied to the positive or negative output terminal by the voltage Vso. When the transistor Q1 is on at this time, the current Iai is output to the positive or negative output terminal Iop or Ion, while when the transistor Q2 is on, the current is not supplied to any output terminal, so a "0" output is obtained.

On the other hand, the second current switch formed by the transistors Q3 and Q4 controls to which of the positive or negative output terminal the current is supplied by the voltage Vop. At this time, when the transistor Q3 is on, the current Iai is output to the positive output terminal Iop and the "a" output side is switched to, while when the transistor Q4 is on, the current Iai is output to the negative output terminal Ion and the "−a" side is switched to.

In this circuit, by performing the selection of the route of the coefficient "a" or "−a" weighted to the constant current Iai flowing to the output terminal and the switch operation of "0" by not supplying the current by the current switch, a simple and accurate ternary-value output switch circuit can be realized.

Figure 15:
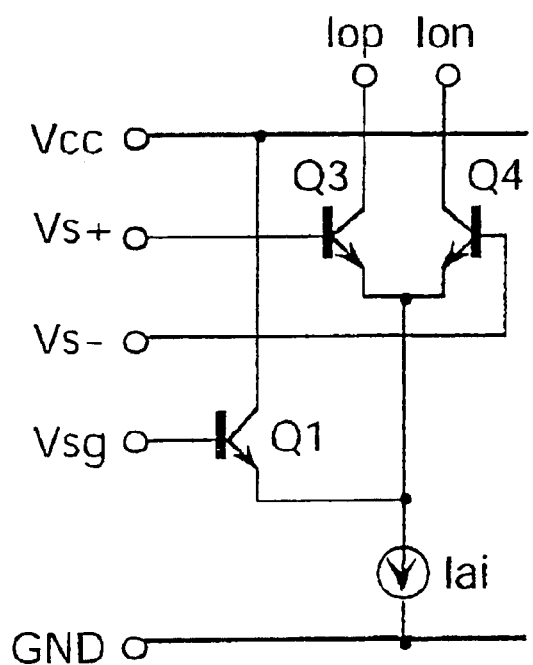
FIG. 15 is a circuit diagram of a second example of configuration of a current switch circuit (switch circuit) in the first embodiment of the present invention.
Figure 16:
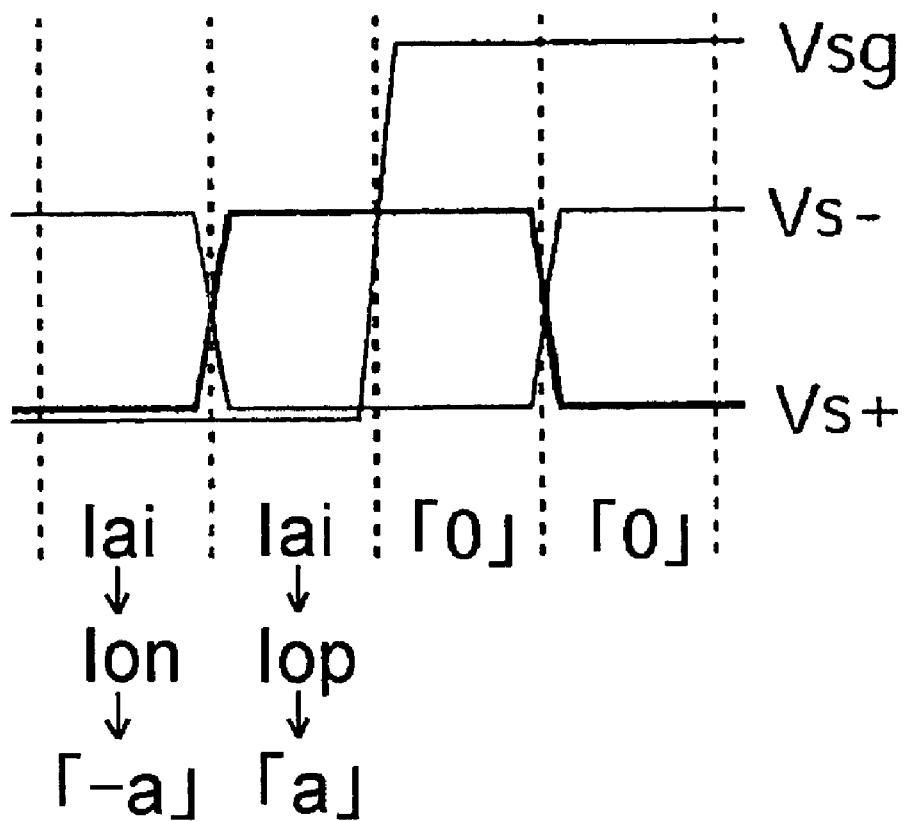
FIG. 16 is a waveform diagram of a control signal of the circuit shown in FIG. 15.

FIG. 15 shows a second example of the configuration of the current switch circuit. A waveform diagram of the control signal of this circuit is shown in FIG. 16.

In this circuit, a common emitter of the transistors Q3 and Q4 is directly connected to the constant current source for flowing the current Iai, and one transistor Q1 is connected between the middle point of the connection and the supply source of the power supply voltage Vcc. The current path of the current Iai is switched by the base voltages Vsg, Vs+, and Vs− of the transistors Q1, Q2, and Q3. By making only one of these three voltages "H", the current path is determined. The characteristic feature of this circuit is that the number of the vertically stacked transistors is small, so this is suited to low voltage operation.

When trying to control the voltages Vsg, Vs+, and Vs− by the usual binary logic, the front stage pulse generation circuit becomes complex in comparison with the case of the first configuration shown in FIG. 14, but by shifting the levels of the voltages Vsg, Vs+, and Vs−, the front stage pulse generation circuit can be simplified. Namely, as shown in FIG. 16, when taking the "H" level of the voltage Vsg higher than the voltages Vs+ and Vs−, priority is given to Vsg when the Vsg is "H", and it is not necessary to make Vs+ and Vs− "L".

Figure 17:
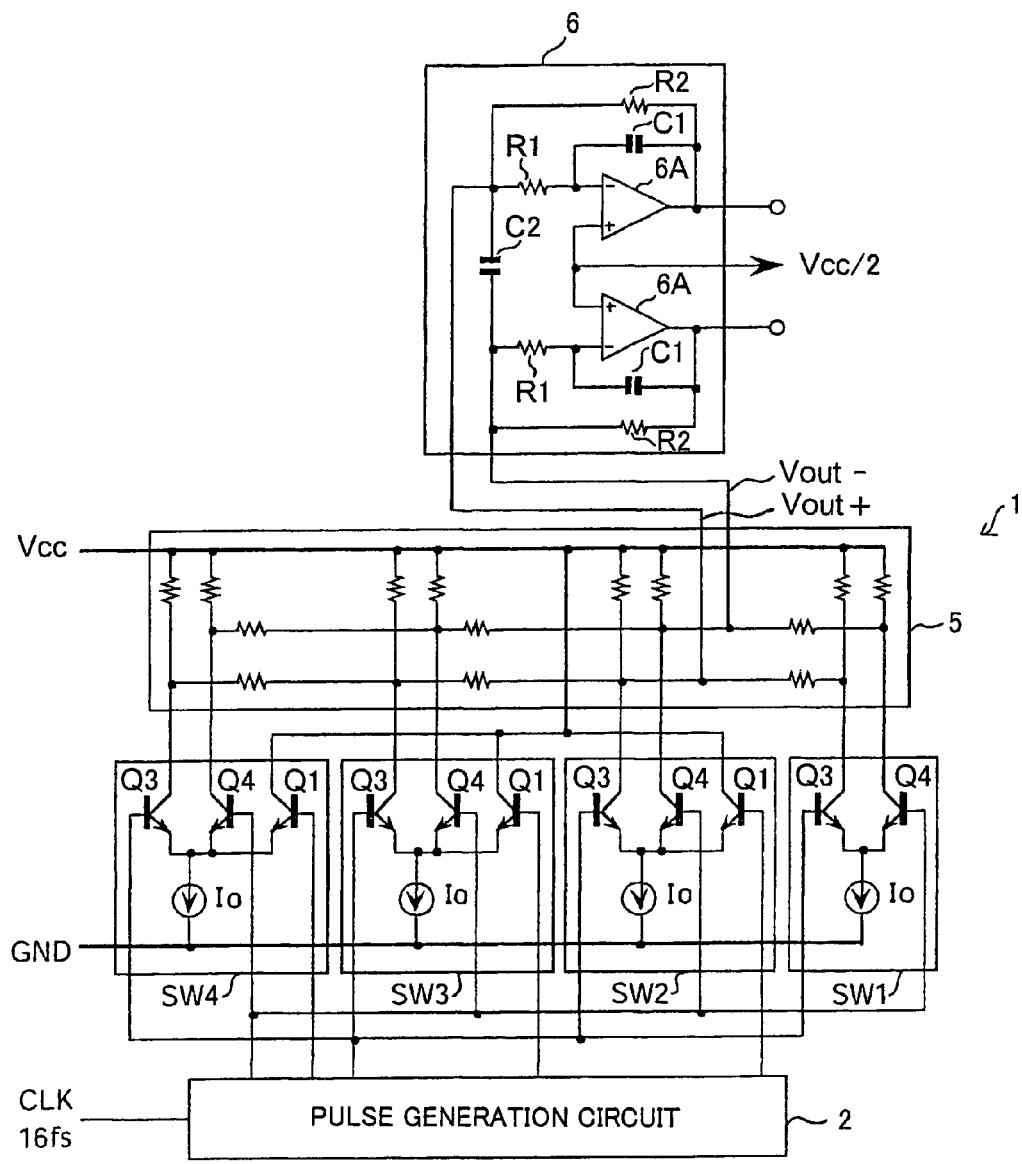
FIG. 17 is a circuit diagram showing a more detail an example of the configuration of the sine wave generation circuit using a current switch circuit having the second configuration in the embodiment of the present invention for the switch circuit.

FIG. 17 is a circuit diagram of a more detailed example of the configuration of a sine wave generation circuit using a current switch circuit having the second configuration for the switch circuit. This sine wave generation circuit exemplifies the case where the number of switch circuits n=4.

The first switch circuit SW1 is configured as a binary-value output type by omitting the transistor Q1 in FIG. 16, while the second to fourth switch circuits SW2 to SW4 are configured as ternary-value output types. The same current Io is supplied to four switch circuits SW1 to SW4. The power supply voltage Vcc is supplied to the ternary-value switch circuits SW2 to SW4. In all switch circuits, the transistor Q3 is controlled by the common signal. Vs+, and the transistor Q4 is controlled by the common pulse signal Vs−. Further, the transistors of the second to fourth switch circuits are controlled by the pulse signal Vsg. These pulse signals Vs+, Vs−, and Vsg are generated by the pulse generation circuit 2.

The output values "ai" and "−ai" of all switch circuits are set by the resistance value of the resistor ladder circuit 5 connected to their positive and negative output terminals. Positive output terminals are connected to the supply line of the power supply voltage Vcc via the resistors and connected to the adjacent positive output terminals via the resistors. These resistors are connected in the same way for the negative output terminals as well. A positive voltage Vout+0 of the pseudo sine wave is output from the positive output terminal of the second switch circuit SW2, while a negative voltage Vout− of the pseudo sine wave is output from the negative output terminal of the second switch circuit SW2. The pseudo sine wave comprised by these output voltages vout+ and vout− has for example 16 values. As previously explained by using the case of the quarterly-value output of two switch circuits, the resistance values of the resistor ladder circuit 5 are set based on the sampling theory so that a pseudo sine wave nearer a sine wave is output.

Note that this resistor ladder circuit 5 and the first to fourth switch circuits SW1 to SW4 constitute embodiments of the "coefficient generation circuit" and the "voltage output circuit" of the present invention.

The output stage of the voltage output circuit 1 is connected to a second order low pass filter 6. This low pass filter 6 has operation amplifiers 7A on the positive side and negative side of the pseudo sine wave, resistors R1 connected in series with the inverted input terminals of the operation amplifiers, feedback capacitors C1 connected between the outputs of the operation amplifiers and the inverted input terminals, and feedback resistors R2 connected between the outputs of the operation amplifiers and the input terminals of the pseudo sine wave. A cutoff capacitor C2 is connected between the input terminals of the positive side and negative side of the pseudo sine wave, and a voltage Vcc/2 is supplied to the inverted input of each operation amplifier.

A pseudo sine wave having harmonic components eliminated by the filter characteristic in accordance with the resistance values and capacitance values is output from between two operation amplifier outputs of the low pass filter 6 having such a configuration.

Let us consider the distortion rate expected for this sine wave generation circuit.

The 15th and 17th harmonics at the outputs of the resistor ladder are attenuated by 23.6 dB and 24.7 dB as shown in FIG. 7. When assuming that the cutoff frequency of the low pass characteristic of the low pass filter 6 is 1.5 times the output frequency considering variation, the harmonics are further attenuated by 40 dB and 21.2 dB and become magnitudes attenuated by 63.6 dB and 66.9 dB. Accordingly, in theory, a distortion rate of 0.1% is obtained. If the filter characteristic is made the third order, in theory, a distortion rate of 0.01% will be obtained.

The sine wave generation circuit using the current switches shown in FIG. 17 switches the path of the constant current Io by a high speed bipolar transistor, so is suitable for the purpose of high precision, high speed sine wave generation. This sine wave generation circuit corresponds to 16-time sampling of the half cycle octonary-values. By a simple low pass filter of about the second order, a harmonic distortion rate of 0.1% can be easily realized. When the sine wave generation circuit is given a 16-value 32-time sampling configuration or even in the case of an 8-value 16-time sampling, if a low pass filter of the third or higher order is used, a harmonic distortion rate of 0.01% or less can be realized, so this is preferred as a high performance sine wave generation circuit.

Note that the coefficients explained above are relative and do not mean absolute values. Further, the output values from the switch circuits such as "ai", "0", and "−ai" do not mean absolute values with respect to the ground, but relative using the any potential as a reference.

Second Embodiment

The second embodiment of the present invention shows that the coefficient generation circuit can be realized by a configuration other than switch circuits.

Figure 18:
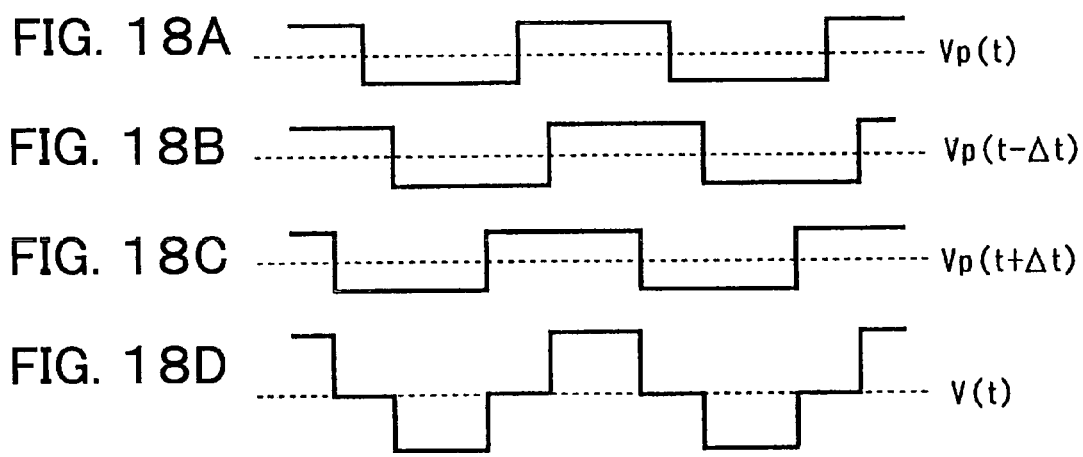
FIGS. 18A to 18D is a signal waveform diagram of a case where a ternary-value output is generated by binary-value output addition in the embodiment of the present invention.

A ternary-value output voltage can be realized by adding two binary-value output pulses. FIG. 18 shows the signal waveform diagram of the case of generating a ternary-value output by this binary-value output addition.

First, a rectangular wave Vp(t) having a duty ratio of 50% shown in FIG. 18A is shifted to the front and the rear at the same time. By this, two rectangular waves Vp(t−Δt) and Vp(t−Δt) shown in FIG. 18B and FIG. 18C are generated. By adding these two rectangular waves, as shown in FIG. 18D, a rectangular wave v(t) of the ternary-value output can be generated as the output vout.

Figure 19:
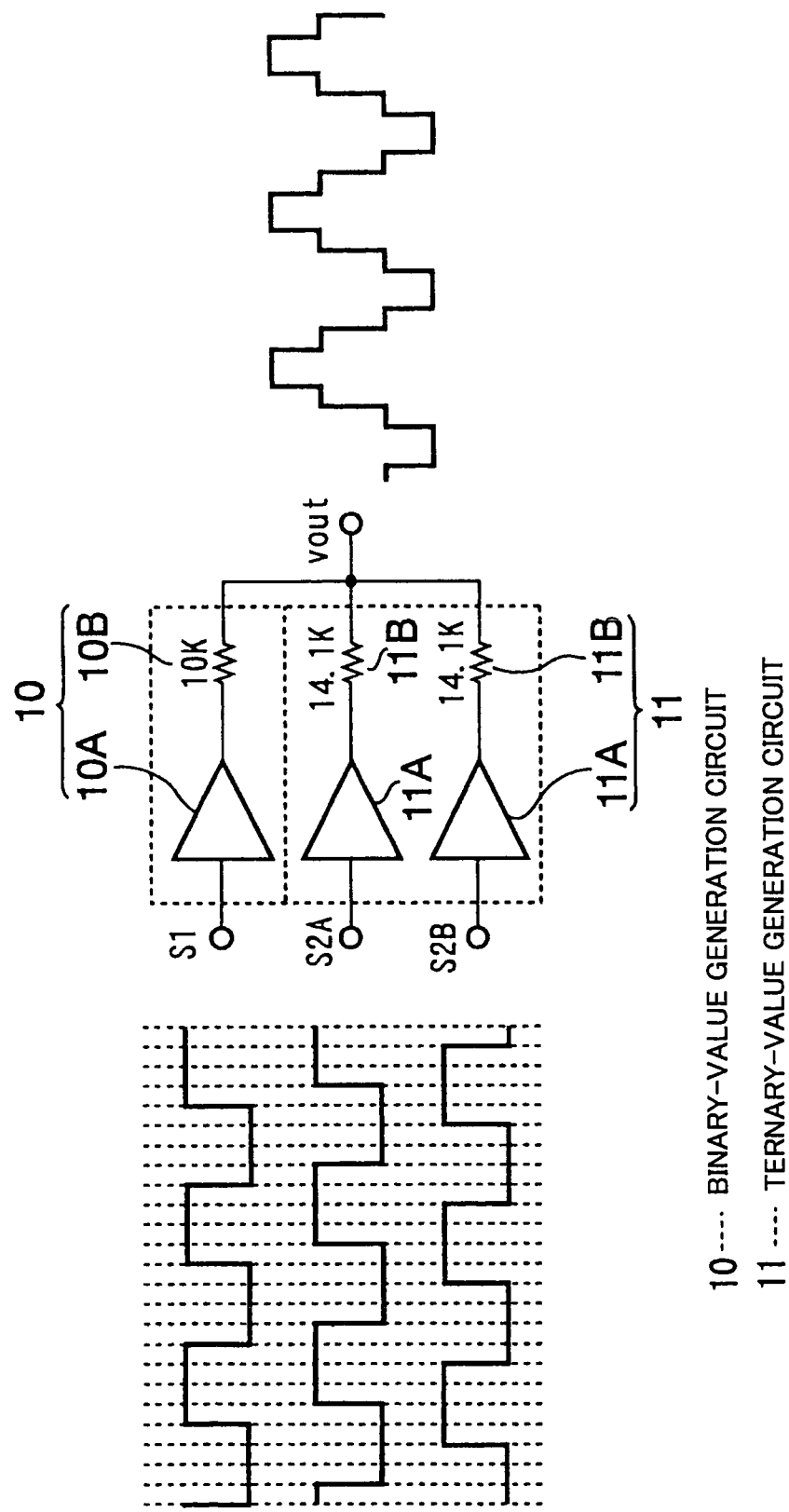
FIG. 19 is a view of the configuration of part of the sine wave generation circuit for generating a ternary-value output by binary-value output addition in the embodiment of the present invention.

FIG. 19 shows the configuration of part of a sine wave generation circuit to which this method is applied.

In this sine wave generation circuit, the not shown pulse generation circuit and the output circuit (low pass filter) have a coefficient generation circuit comprising a binary-value generation circuit 10 and a ternary-value generation circuit 11 connected between them. The binary-value generation circuit 10 comprises an amplifier 10A connected in series to the input terminal of the pulse signal S1 thereof and a resistor 10B having a value in accordance with the coefficient to be generated.

On the other hand, the ternary-value generation circuit 11 is comprised of two of these binary-value generation circuits 10 joined together. Namely, the series-connected amplifier 11A and resistor 11B having a value in accordance with the coefficient to be generated are connected to the input terminals of pulse signals S2A and S2B. The pulse signals S2A and S2B are signals obtained by shifting the pulse signal S1 supplied to the binary-value generation circuit 10 to the front and the rear by a predetermined time. These signals are generated by a not illustrated pulse generation circuit.

This sine wave generation circuit does not add a coefficient to the current, but adds a coefficient to the voltage and further configures the ternary-value generation circuit by two binary-value generation circuits, therefore can use the pulse signal as it is for adding the coefficient. For this reason, the advantages are obtained that the configuration of the circuit for generating the binary-value pulse signal is simplified and the configuration of the coefficient generation circuit is simple. Note that if trying to make the output voltage vout a further finer number of voltage levels such as a half cycle octonary-values, 16 values, or 32 values, the circuit can be realized by increasing the number of parallel connections of ternary-value generation circuits 11 each comprising two binary-value generation circuits. At this time, each resistance value is determined on the basis of the sampling theory mentioned above so that the output pseudo sine wave becomes nearer to a sine wave.

Third Embodiment

The third embodiment of the present invention explains the case where the sine wave generation circuits of the first and second embodiments are used for automatic adjustment of the cutoff frequency of a monolithic filter of the master/slave type.

Below, a description will be made of the automatic adjustment of the cutoff frequency of the monolithic filter, then the configuration etc. of the present embodiment will be explained by taking as an example the case where the sine wave generation circuit of the second embodiment is applied.

Figure 20:
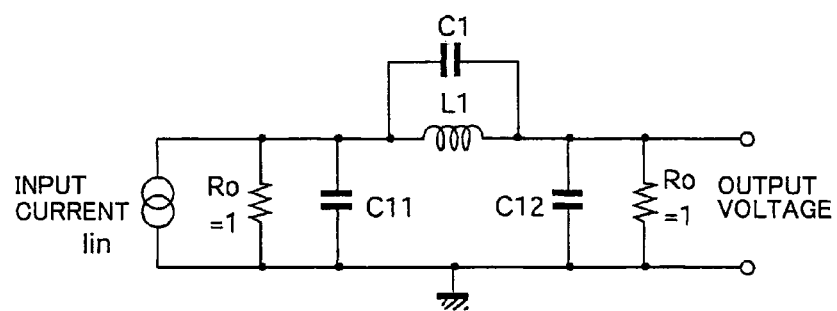
FIG. 20 is a view of an example of the circuit of a third order low pass LC filter in the embodiment of the present invention.

FIG. 20 shows a third order low pass LC filter.

This circuit cannot be realized on an IC as it is. Therefore, use is made of a means of equivalently realizing resistance and inductance by using for example a Gm (transmission conductance) circuit.

Figure 21:
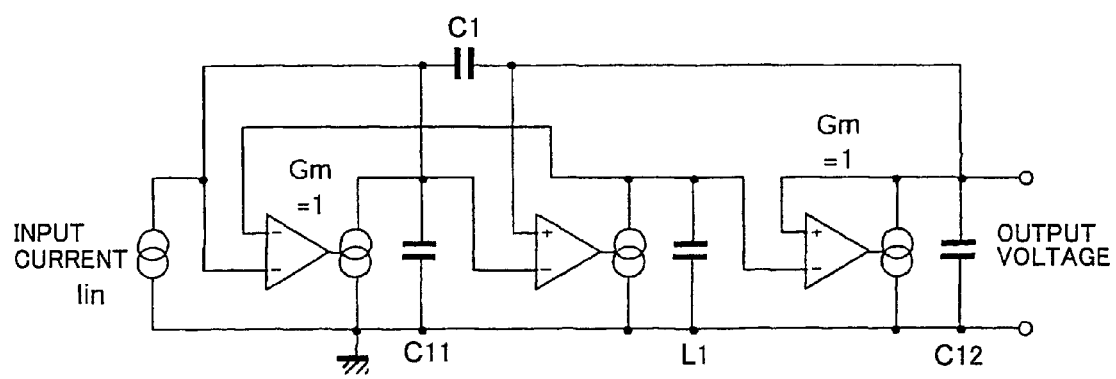
FIG. 21 is a circuit diagram of a Gm-C filter in the embodiment of the present invention.

FIG. 21 shows an embodiment thereof. This circuit equivalently realizes inductance by capacitance by using two Gm circuits and therefore is referred to as the "gyrator type" or is configured by the transmission conductance Gm and the capacitance C so is also referred to as a "Gm-C filter".

Figure 22:
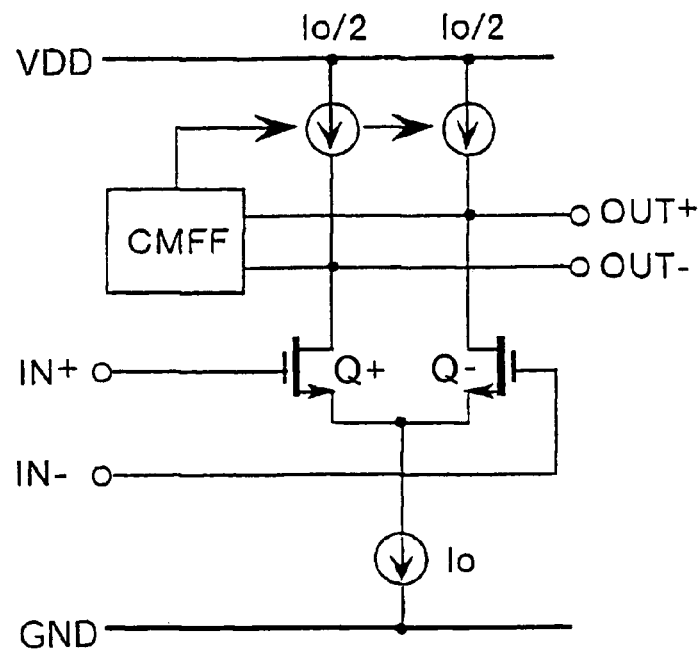
FIG. 22 is a circuit diagram of an example of the configuration of a Gm (transmission conductance) circuit in the embodiment of the present invention.

FIG. 22 shows a concrete example of the configuration of the Gm (transmission conductance) circuit.

A pair of common source differential transistors Q+ and Q− are used as the Gm circuit. A same phase feedback circuit CMFB is provided for determining the same phase potential of outputs OUT+ and OUT−.

The cutoff frequency is one of the most important characteristics of a filter. In a Gm-C filter, the cutoff frequency is determined by the ratio of Gm and C. The precision of the capacitance C is about ±5 to 30%. Also, the Gm value of the Gm circuit shown in FIG. 22 usually has a variation of about ±20% and also has temperature dependency. Accordingly, the cutoff frequency of a simply built in filter circuit has an extremely poor precision and is extremely limited in application as it is.

Figure 23:
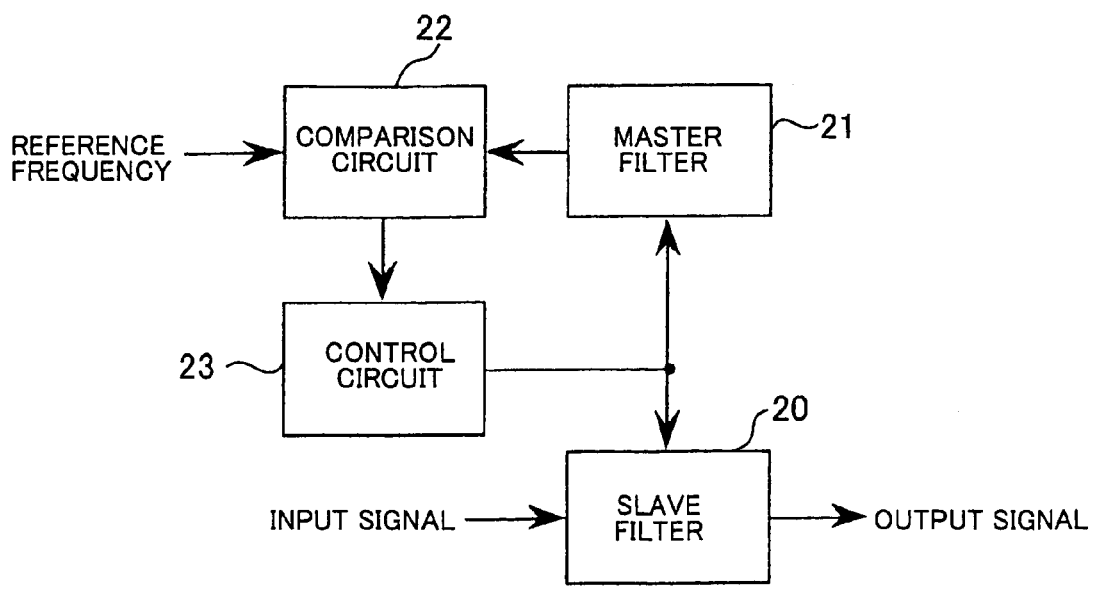
FIG. 23 is a general block diagram of an automatic adjustment circuit of a cut-off frequency of a master/slave system in the embodiment of the present invention.

As the means for overcoming the above problem, there is an automatic adjustment circuit of the cutoff frequency of the master/slave type. The concept thereof will be shown in FIG. 23.

A slave filter 20 is a filter inherently designed to generate an output signal without applying desired filtering to the input signal. There is a master filter 21 formed by the same circuit format. The transmission characteristic of the master filter 21 is compared with the reference frequency by a comparison circuit 22. The output of the comparison circuit 22 controls for example the Gm of the Gm-C filter via the control circuit 23 so that the master filter 21 becomes a desired frequency characteristic. The slave filter 20 has the same Gm circuit as that of the master filter and is controlled so as to obtain the same Gm, therefore even if for example the capacitance C varies, the slave circuit also becomes a desired frequency characteristic expected as the design value.

Which characteristic of the master filter 21 is to be compared with the reference frequency is determined by mainly using two types of methods.

A first method is the method of configuring an oscillator by using the master filter 21 and performing frequency comparison so that the oscillation frequency becomes the same as the comparison frequency or has a relationship of a certain ratio. In this case, the master filter 21, the comparison circuit 22, and the control circuit 23 constitute a phase locked loop (PLL).

A second method is the method of inputting the reference frequency to the master filter 21 and performing phase comparison so as to compare the output phase of the master filter 21 with the reference frequency. When for example the Gm of the Gm-C filter is controlled so as to obtain a phase of a constant value at a specific frequency, the frequency characteristic becomes the desired characteristic. Between the frequency comparison and the phase comparison, phase comparison is more generally used. This is because the circuit configuration is simple and the design is easy.

Figure 24:
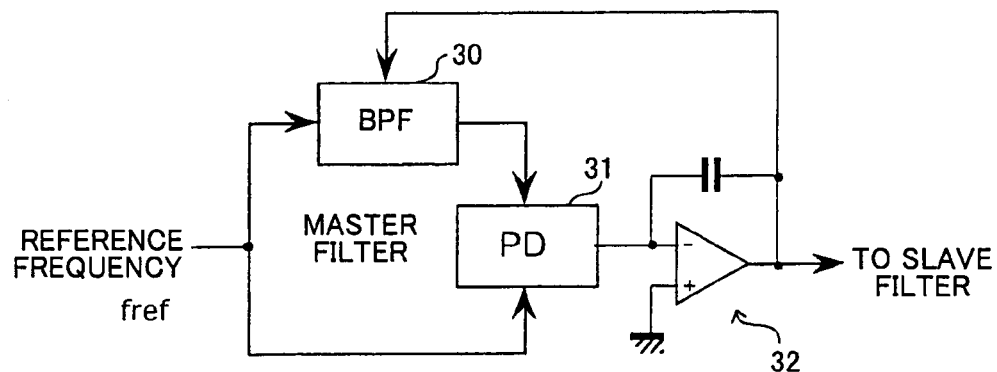
FIG. 24 is a general block diagram of the automatic adjustment circuit of the cut-off frequency of the master/slave system by phase comparison in the embodiment of the present invention.

FIG. 24 shows the master/slave system by the phase comparison.

A reference frequency fref is added to one input of a band pass filter (BPF) 30 and a phase detector (PD) 31 acting as the master filter. The output of the band pass filter 30 is added to the other input of the phase detector 31.

Figure 25:
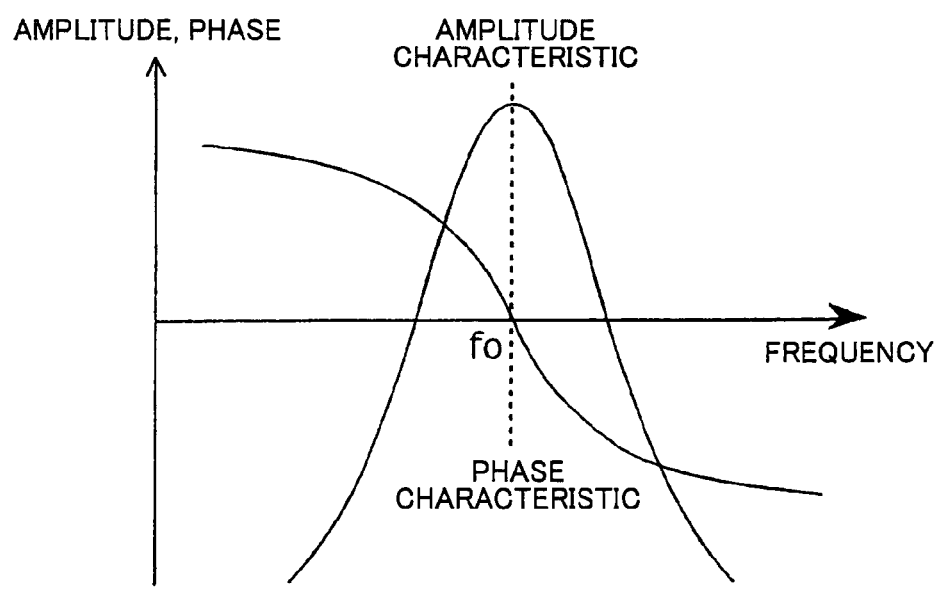
FIG. 25 is a characteristic diagram of an amplitude and a phase response of a band pass filter in the embodiment of the present invention.

The amplitude and the phase response of the band pass filter 30 become as shown in FIG. 25. At the center frequency fo, the phase difference of the input and the output becomes zero. Accordingly, when the input and output of the band pass filter 30 are compared at the phase comparator 31, the phase difference is integrated, and the control voltage or the control current for determining the Gm of for example the band pass filter 30 is made variable, feedback is applied so that a steady phase difference becomes zero, and the band pass filter operates so as to obtain a center frequency $f_o$ equal to the reference frequency fref. When this control voltage or the control current is supplied to also the slave filter via the output circuit 32, the slave filter can realize the desired cutoff frequency even if the capacitance C and the transmission conductance Gm vary so far as the relative ratio is kept.

The reference frequency is formed from the reference clock frequency provided in the system. If there is a harmonic component, the phase largely turns with respect to the harmonic. Therefore, even if looking at the phase of the zero cross point of the output signal of the band pass filter, the phase of the basic wave will not be correctly seen. In order to avoid error due to the harmonic, it is necessary to attenuate the harmonic component by raising the Q of the band pass filter and reducing the influence of the harmonic component or by passing the reference clock frequency through the band pass filter or the low pass filter in advance.

When using the sine wave generation circuit of the present embodiment for the generation of this reference frequency fref, the harmonic can be easily attenuated by a simple circuit. Therefore, deviation of the cutoff frequency due to the deviation of the phase at the phase comparator can be effectively prevented.

Figure 26:
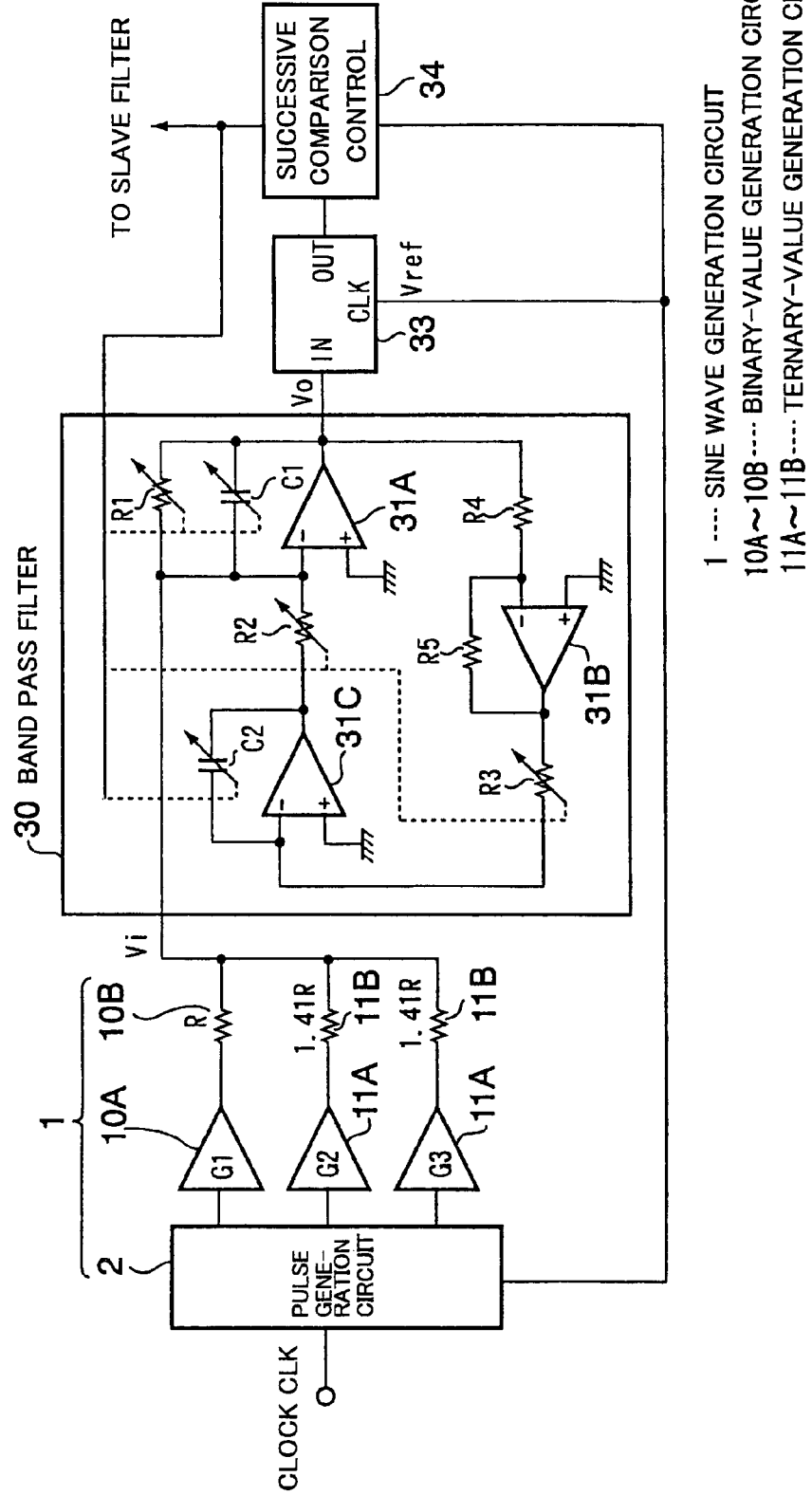
FIG. 26 is a view of the configuration of an automatic adjustment circuit of the cut-off frequency of the master/slave system by phase comparison according to the first embodiment of the present invention.

FIG. 26 shows an embodiment of a sine wave generation circuit using this principle. Two values are generated at a gate (G1) 10A, ternary-values are equivalently generated at a gate (G2 and G3) 11A, and a quarterly-value output is synthesized by weighting the values by the resistances. The spectrum of the synthesized signal is just like FIG. 7. A sine wave having a harmonic distortion rate of about 5% is obtained by just adding the capacitance to the output. If a second order low pass filter is attached, a harmonic distortion of 1% or less can be achieved.

This quarterly-value output is input to the band pass filter 30 acting as the master filter. The band pass filter 30 is configured by operation amplifiers 31A to 31C, resistors R1 to R5, and capacitances C1 and C2.

The pseudo sine wave generated in this embodiment is applied to the inverted input terminal "−" of the operation amplifier 31A as a virtual ground, therefore is input not as the voltage, but as the pseudo sine wave current Ii of the frequency f. Ii passes through the band pass filter 30 and becomes the output Vo. The output Vo is input to a latched comparator 33 and compared with the signal Vref acting as the reference clock used also in the pulse generation circuit 2. The reference signal Vref has the same frequency as Ii and has the same phase. Further, in the band pass filter 30, if the center frequency is equal to the signal frequency, the phases of the input and the output are the same, if the center frequency is lower than the signal frequency, the phase lags, and if the center frequency is higher than the signal frequency, the phase is advanced. The latched comparator 33 outputs "H" when the output Vo is positive at the rising of the pulse of the reference signal Vref, and outputs "L" when it is negative. The center frequency of the band pass filter 30 can be changed by changing the values of one or both of the capacitances C1 and C2 and the resistors R1 and R3 composing the same. In this embodiment, the successive comparison control circuit 34 judges the phases of the voltage Vo and the reference signal Vref. By relatively changing the capacitance or resistance or both one after another, control is carried out so as to obtain the desired center frequency. The successive comparison outputs are supplied to also the slave filter. By keeping a predetermined ratio with the CR value of the master filter, the filter characteristic of the slave filter also becomes the desired one.

Figure 27:
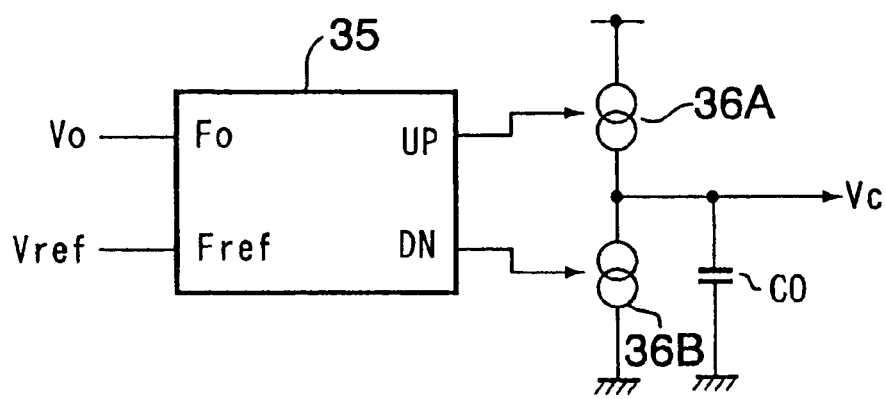
FIG. 27 is a view of another means of the phase comparison in a second embodiment.

FIG. 27 shows another means of the phase comparison.

In the example of FIG. 26, the parameter CR is controlled by the successive comparison in a digital manner. Contrary to this, in the example of FIG. 27, an analog like output is obtained by using not the latched comparator, but the phase comparator 35. The phase comparison output controls a charge pump circuit comprising a current source 36A and a current attracting current source 36B. The output thereof is integrated by the capacitance C0. The output Vc thereof controls the capacitance C or the resistance R or both of them in an analog manner.

In the above automatic adjustment circuit of the cutoff frequency, the sine wave generation circuit 1 is realized by a very simple circuit configuration, that is, a sine wave having a harmonic distortion rate of one to a few % is obtained by a circuit of an extent weighting the outputs of three gates 10A, 11A, and 11A by the resistances 10B, 11B, and 11B. Therefore, an automatic adjustment circuit of the cutoff frequency of the monolithic filter of the master/slave method without phase deviation has been realized.

Fourth Embodiment

The fourth embodiment of the present invention shows a case where the sine wave generation circuit of the present invention is applied to an angle detection device.

Figure 28:
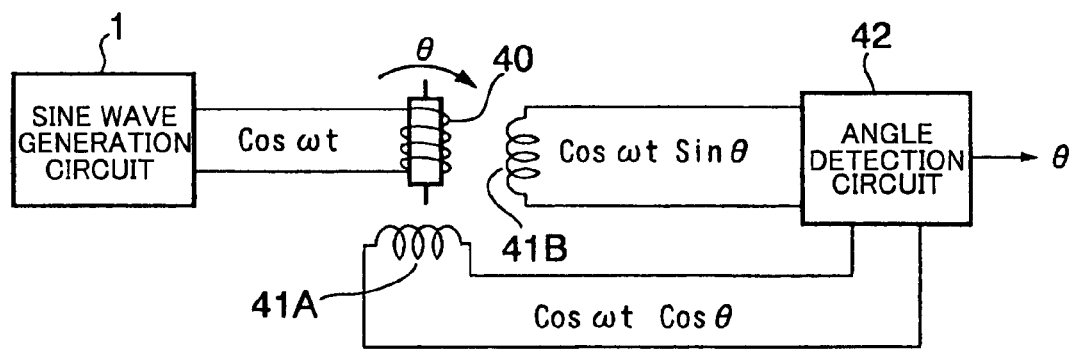
FIG. 28 is a view of the configuration of an angle detection device according to a third embodiment of the present invention.

The angle detection device shown in FIG. 28 is a device for electrically detecting the rotation angle of a machine shaft. The pseudo sine wave from the sine wave generation circuit 1 is supplied to a rotor 40. A coil of the rotor 40 is driven by a signal such as Cos ωt by the sine wave generation circuit 1. A stator is provided with two orthogonal coils 41A and 41B which output Cos ωt Cos θ and Cos ωt Sin θ. On the basis of the two signals Cos ωt Cos θ and Cos ωt Sin θ from the stator, finally the angle θ of the stator is output from the angle detection circuit 42.

Such an angle detection device has a detection portion having the same structure as the motor and is not provided with an optical or semiconductor magnetic sensor etc., therefore has the characterizing feature that the reliability is extremely high even under severe environments of for example fouling by oil, dust, etc., heat, vibration, etc. In order to detect the machine angle θ with a high precision, Cos ωt for driving the rotor coil must have a low distortion and low noise. In the present embodiment, the sine wave generation circuit 1 generates a pseudo sine wave having a high purity (particularly phase) with a simple circuit, so the precision of the angle detection is improved.

According to the sine wave generation circuit of the present invention, the following effects are exhibited.

First, the odd number generation circuit for generating odd number values of three or more values comprising coefficients on the positive side and coefficients on the negative side symmetric about one coefficient at the center is included. Therefore, coefficients suitable for a sine wave in which the positive side and negative side harmonic values are symmetric about the center line of the voltage are easily generated, and the precision of the output pseudo sine wave is high.

Second, an odd number generation circuit for generating odd number values of ternary-values or more is included, and a coefficient train is generated by combining the outputs thereof, so a pseudo sine wave without phase deviation is generated.

Third, the pulse signal output from the pulse circuit can be commonly used for a plurality of coefficient generation circuits. Accordingly, the number of the pulse signals may be small.

Fourth, the circuit is not large in size and not complex either. Further, the circuit does not increase much in size due to the higher precision does not become complex either. Explaining this in more detail, the coefficient series is generated by combining coefficients generated from a plurality of coefficient generation circuits. This determines the fineness of the pseudo sine wave. Therefore, when trying to make this pseudo sine wave high in precision, the number of the coefficient generation circuits will be increased. Along with this, though depending on the method of combination of the coefficients, for example, if the number of coefficient generation circuits is doubled, the number of the voltage change points in one cycle will increase to about 2 times. The configuration of the coefficient generation circuit is a repetition of the same circuits. Even if the number increases, the circuit is not complex. Rather than this, the size of the pulse generation circuit does not become large, so the overall circuit does not greatly increase in size and does not become complex. In this way, according the sine wave generation circuit of the present invention, it becomes possible to provide a sine wave generation circuit wherein the circuit configuration can be simplified and wherein even if a high precision pseudo sine wave is generated by increasing the number of voltage changes in one cycle of the sine wave, the circuit does not increase that much in size and the configuration does not become complex.

Further, according to the sine wave generation circuit of the present invention, the number of the pulse signals to be generated by the pulse generation circuit may be two or three at the maximum and the number of the control signals may be extremely small. Further, the coefficient generation circuit has a binary-value or ternary-value output. Therefore a simple configuration is sufficient. However, high precision pseudo sine wave can be easily generated by just increasing the number of the coefficient generation circuits. In addition to the fact that a coefficient generation circuit of a binary-value or ternary-value output per se can be given a simple configuration, the configuration repetitive, so the overall circuit is not large in size and not complex either. Further, above all, the circuit of the pulse generation circuit is simple. Even if the pseudo sine wave is made high in precision, the size thereof does not increase.

While the invention has been described with reference to specific embodiment chosen for purpose of illustration, it should be apparent that numerous modifications could be made thereto by those skilled in the art without departing from the basic concept and scope of the invention.

What is claimed is:

1. A sine wave generation circuit for stepwisely changing a voltage level of an output signal in synchronization with an input clock signal and generating a pseudo sine wave, comprising:
   a pulse generation circuit for generating a plurality of pulse signals in synchronization with said clock signal; and
   a voltage output circuit having a plurality of coefficient generation circuits, for generating a voltage signal proportional to a plurality of different coefficients generated in said coefficient generation circuits in response to said plurality of pulse signals and stepwisely changing the voltage level of said output signal,
   said plurality of coefficient generation circuits generating said plurality of coefficients of an odd number at least ternary-coefficient-values including a first coefficient, and, a second coefficient at a positive side and a third coefficient at a negative side arranged symmetrically about a center of the first coefficient.

2. A sine wave generation circuit as set forth in claim 1, wherein when the number of said plurality of coefficient generation circuits is n, where n is a natural number equal or greater than of 2, said n number of coefficient circuits includes, at least (n−1) number of ternary-value generation circuits.

3. A sine wave generation circuit as set forth in claim 2, wherein said plurality of coefficient generation circuits comprise a voltage generation circuit, said voltage generation circuit includes:
   one binary-value generation circuit for alternately outputting a positive coefficient value and a negative coefficient value in accordance with the control of said pulse signals; and
   the (n−1) number of ternary-coefficient-value generation circuits for repeatedly outputting a reference value, and a coefficient value at the positive side and another coefficient value at the negative side to the reference value in accordance with the control of said pulse signals, and
   where the voltage generation circuit generates a voltage signal proportional to a odd number sampling value of the sine wave, when carrying out the sampling of the sine wave to perform an equal period sampling of 4×n points including the maximum value and minimum value of the sine wave, and defining the maximum value sampling point as a 0-th number sampling point, and the minimum value sampling point after a half period as 2n-th number sampling point.

4. A sine wave generation circuit as set forth in claim 1, wherein:
   each of said plurality of coefficient generation circuits has a voltage generation circuit including n number of ternary-value generation circuits repeatedly outputting a reference value, a value at the positive side of the reference value and a value at the negative side of the reference value, under the control of said pulse signals, and
   the voltage generation circuit generates a voltage signal proportional to an even number sampling value of the sine wave, when carrying out the sampling of the sine wave to perform an equal period sampling of 4×n points including the maximum value, and minimum value of the sine wave, and defining the maximum value sampling point as a 0-th number sampling point, and the minimum value sampling point after a half period as 2n-th number sampling point.

5. A sine wave generation circuit as set forth in claim 2, wherein
   each of said plurality of coefficient generation circuits has a voltage generation circuit including n number of ternary-value generation circuits repeatedly outputting a reference value, a value at the positive side of the reference value and a value at the negative side of the reference value, under the control of said pulse signals, and
   the voltage generation circuit generates a voltage signal proportional to an even number sampling value of the sine wave, when carrying out the sampling of the sine wave to perform an equal period sampling of 4(n+1) points including the maximum value, and minimum value of the sine wave, and defining the maximum value sampling point as a 0-th number sampling point, and the minimum value sampling point after a half period as 2n-th number sampling point.

6. A sine wave generation circuit as set forth in claim 1, wherein said plurality of coefficient generation circuits comprise a voltage generation circuit,
   said voltage generation circuit includes:
   one binary-value generation circuit for alternately outputting a positive value and a negative value under the control of said pulse signals; and
   (n−1) number of ternary-value generation circuits for repeatedly outputting a reference value, a value at the positive side of the reference value and a value at the negative side of the reference value, under the control of said pulse signals, and
   the voltage generation circuit generates a voltage signal proportional to an even number sampling value of the sine wave, when carrying out the sampling of the sine wave to perform an equal period sampling of 4(n+1) points including the maximum value, and minimum value of the sine wave, and defining the maximum value sampling point as a 0-th number sampling point, and the minimum value sampling point after a half period as 2n-th number sampling point.

7. A sine wave generation circuit as set forth in claim 1, wherein said pulse generation circuit comprises a shift circuit for outputting a first rectangular signal synchronized with said input clock signal and a second rectangular signal delayed by a predetermined time width, and
   wherein said ternary-value generation circuits add the first rectangular signal and the second rectangular signal to result in an equivalent ternary-value coefficient.

* * * * *